US010903236B2

(12) United States Patent
Choi et al.

(10) Patent No.: US 10,903,236 B2
(45) Date of Patent: Jan. 26, 2021

(54) THREE-DIMENSIONAL SEMICONDUCTOR MEMORY DEVICE

(71) Applicant: SAMSUNG ELECTRONICS CO., LTD., Suwon-si (KR)

(72) Inventors: Kangyoon Choi, Seoul (KR); Dong-Sik Lee, Hwaseong-si (KR); Jongwon Kim, Hwaseong-si (KR); Gilsung Lee, Seoul (KR); Eunsuk Cho, Suwon-si (KR); Byungyong Choi, Seongnam-si (KR); Sung-Min Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/663,228

(22) Filed: Oct. 24, 2019

(65) Prior Publication Data

US 2020/0212061 A1 Jul. 2, 2020

(30) Foreign Application Priority Data

Dec. 26, 2018 (KR) .......................... 10-2018-0169432

(51) Int. Cl.
*H01L 27/11582* (2017.01)
*H01L 23/522* (2006.01)
(Continued)

(52) U.S. Cl.
CPC .... *H01L 27/11582* (2013.01); *H01L 23/5226* (2013.01); *H01L 23/5283* (2013.01); *H01L 27/11565* (2013.01); *H01L 27/11573* (2013.01); *H01L 29/04* (2013.01); *H01L 21/0217* (2013.01); *H01L 21/0257* (2013.01); *H01L 21/0262* (2013.01); *H01L 21/02164* (2013.01); *H01L 21/02532* (2013.01); *H01L 21/02595* (2013.01); *H01L 21/02598* (2013.01);
(Continued)

(58) Field of Classification Search
None
See application file for complete search history.

(56) References Cited

U.S. PATENT DOCUMENTS 9,299,718 B2 3/2016 Park et al.
9,502,432 B1 11/2016 Shin
(Continued)

FOREIGN PATENT DOCUMENTS

KR 10-2019-0124031 11/2019

*Primary Examiner* — Thien F Tran
(74) *Attorney, Agent, or Firm* — F. Chau & Associates, LLC

(57) ABSTRACT

A three-dimensional (3D) semiconductor memory device includes a substrate that includes a cell array region and a connection region, a dummy trench formed on the connection region, an electrode structure on the substrate and that includes vertically stacked electrodes that have a staircase structure on the connection region, a dummy insulating structure disposed in the dummy trench, the dummy insulating structure including an etch stop pattern spaced apart from the substrate and the electrode structure, a cell channel structure disposed on the cell array region and that penetrates the electrode structure and makes contact with the substrate, and a dummy channel structure disposed on the connection region and that penetrates the electrode structure and a portion of the dummy insulating structure and that makes contact with the etch stop pattern.

20 Claims, 41 Drawing Sheets

(51) Int. Cl.
  *H01L 27/11565* (2017.01)
  *H01L 27/11573* (2017.01)
  *H01L 29/04* (2006.01)
  *H01L 23/528* (2006.01)
  *H01L 21/768* (2006.01)
  *H01L 21/311* (2006.01)
  *H01L 21/3105* (2006.01)
  *H01L 21/28* (2006.01)
  *H01L 21/02* (2006.01)

(52) U.S. Cl.
  CPC .. *H01L 21/02636* (2013.01); *H01L 21/28035* (2013.01); *H01L 21/31053* (2013.01); *H01L 21/31111* (2013.01); *H01L 21/31144* (2013.01); *H01L 21/76802* (2013.01); *H01L 21/76843* (2013.01); *H01L 21/76877* (2013.01)

(56) References Cited

U.S. PATENT DOCUMENTS

| | | |
|---|---|---|
| 9,716,104 B2 | 7/2017 | Kim et al. |
| 9,842,855 B2 | 12/2017 | Lee |
| 9,893,074 B2 | 2/2018 | Lee et al. |
| 9,972,636 B2 | 5/2018 | Kim et al. |
| 9,978,766 B1 | 5/2018 | Hosoda et al. |
| 9,991,271 B2 | 6/2018 | Kang et al. |
| 2017/0352680 A1 | 12/2017 | Shin et al. |
| 2018/0097009 A1 | 4/2018 | Zhang et al. |
| 2018/0122819 A1 | 5/2018 | Shim et al. |
| 2018/0151672 A1 | 5/2018 | Choi et al. |
| 2018/0350831 A1* | 12/2018 | Kim .................... G11C 7/14 |
| 2019/0035806 A1 | 1/2019 | Jung et al. |
| 2019/0035807 A1 | 1/2019 | Kim et al. |
| 2019/0333923 A1 | 10/2019 | Kim et al. |
| 2020/0152654 A1* | 5/2020 | Hwang ............ H01L 27/11521 |
| 2020/0203370 A1* | 6/2020 | Son ................ H01L 27/11582 |

\* cited by examiner

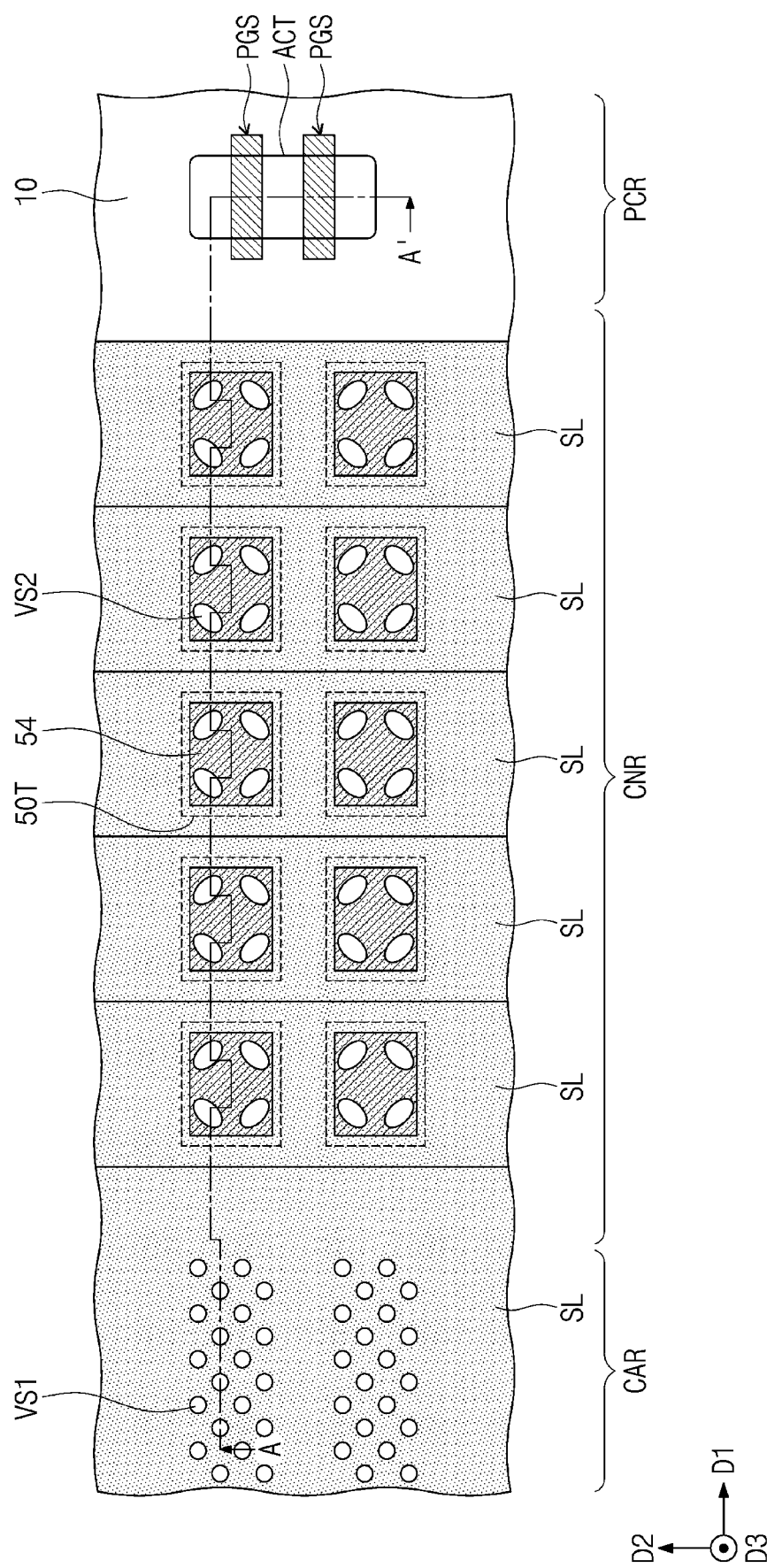

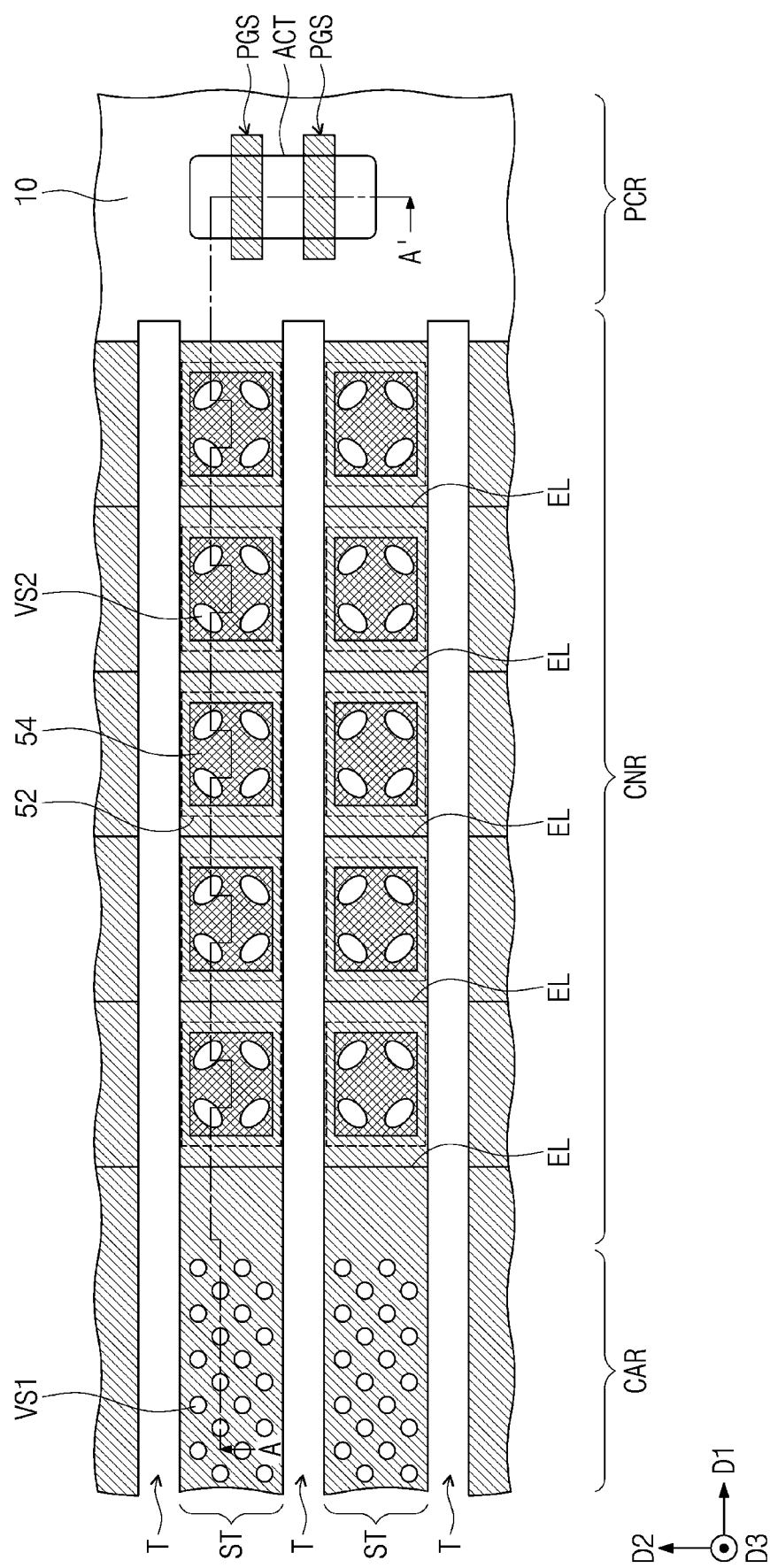

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 from, and the benefit of, Korean Patent Application No. 10-2018-0169432, filed on Dec. 26, 2018 in the Korean Intellectual Property Office, the contents of which are herein incorporated by reference in their entirety.

BACKGROUND

Technical Field

Embodiments of the present disclosure are directed to a three-dimensional semiconductor memory device, and in particular, to a three-dimensional semiconductor memory device with high reliability and a high integration density.

Discussion of the Related Art

Higher integration of semiconductor devices is required to satisfy consumer demands for superior performance and inexpensive prices. In the case of semiconductor devices, since their integration is an important factor in determining product prices, increased intention is especially desired. In the case of conventional two-dimensional or planar semiconductor devices, since their integration is mainly determined by the area occupied by a unit memory cell, integration is influenced b the level of a fine pattern forming technology. However, the expensive process equipment needed to increase patter fineness sets a practical limitation on increasing integration for two-dimensional or planar semiconductor devices. To overcome such a limitation, there have been recently proposed three-dimensional semiconductor memory devices that include three-dimensionally arranged memory cells.

SUMMARY

An embodiment of the inventive concept provides a three-dimensional semiconductor memory device having high reliability and high integration density.

According to an embodiment of the inventive concept, a three-dimensional (3D) semiconductor memory device includes a substrate that includes a cell array region and a connection region, the substrate including a dummy trench on the connection region, an electrode structure disposed on the substrate and that includes vertically stacked electrodes that have a staircase structure on the connection region, a dummy insulating structure disposed in the dummy trench and that includes an etch stop pattern that is spaced apart from the substrate and the electrode structure, a cell channel structure provided on the cell array region and that penetrates the electrode structure and makes contact with the substrate, and a dummy channel structure disposed on the connection region and that penetrates the electrode structure and a portion of the dummy insulating structure and makes contact with the etch stop pattern.

According to an embodiment of the inventive concept, a three-dimensional (3D) semiconductor memory device includes a substrate that includes a cell array region and a connection region, an electrode structure disposed on the substrate and that includes vertically stacked electrodes that have a stepwise structure on the connection region, a cell channel structure disposed on the cell array region that penetrates the electrode structure, a dummy channel structure disposed on the connection region that penetrates the electrode structure, a dummy insulating pattern disposed between the dummy channel structure and the substrate, and an etch stop pattern disposed between the dummy insulating pattern and the dummy channel structure. A top surface of the etch stop pattern is positioned below a bottom surface of the cell channel structure.

According to an embodiment of the inventive concept, a three-dimensional (3D) semiconductor memory device includes a substrate that includes a cell array region and a connection region, an electrode structure disposed on the substrate and that includes vertically stacked electrodes that have a staircase structure on the connection region, where each of the electrodes includes a pad portion on the connection region, a cell contact plug coupled to the pad portion of each of the electrodes, dummy channel structures that penetrate the pad portion of each of the electrodes, where the dummy channel structures are disposed around the cell contact plug when viewed in a plan view, an etch stop pattern disposed between bottom surfaces of the dummy channel structures and the substrate, and a dummy insulating pattern disposed between the etch stop pattern and the substrate.

According to an embodiment of the inventive concept, a three-dimensional (3D) semiconductor memory device includes a substrate that includes a cell array region and a connection region, a dummy insulating pattern disposed in the substrate and on the connection region, an electrode structure disposed on the substrate and that includes vertically stacked electrodes that extend from the cell array region to the connection region in a first direction, a cell channel structure disposed on the cell array region and that penetrates the electrode structure, and dummy channel structures disposed on the connection region and that penetrate the electrode structure and the dummy insulating pattern. A top surface of each of the dummy channel structures has a major axis with a first length and a minor axis with a first width that is less than the first length, and the major axes of the dummy channel structures extend in directions different from each other, when viewed in a plan view.

BRIEF DESCRIPTION OF THE DRAWINGS

FIGS. 3A, 3C, 3D, and 3E are enlarged sectional views of a portion 'P2' of FIG. 2A.

FIGS. 15A to 20A are plan views that illustrate a method of fabricating a three-dimensional semiconductor memory device, according to an embodiment of the inventive concept.

FIGS. 17B to 20B are sectional views taken along lines A-A' of FIGS. 17A to 20A, respectively.

It should be noted that these figures are not to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings z may indicate the presence of a similar or identical element or feature.

DETAILED DESCRIPTION

Exemplary embodiments of the inventive concepts will now be described more fully with reference to the accompanying drawings, in which exemplary embodiments are shown.

Figure 1A:
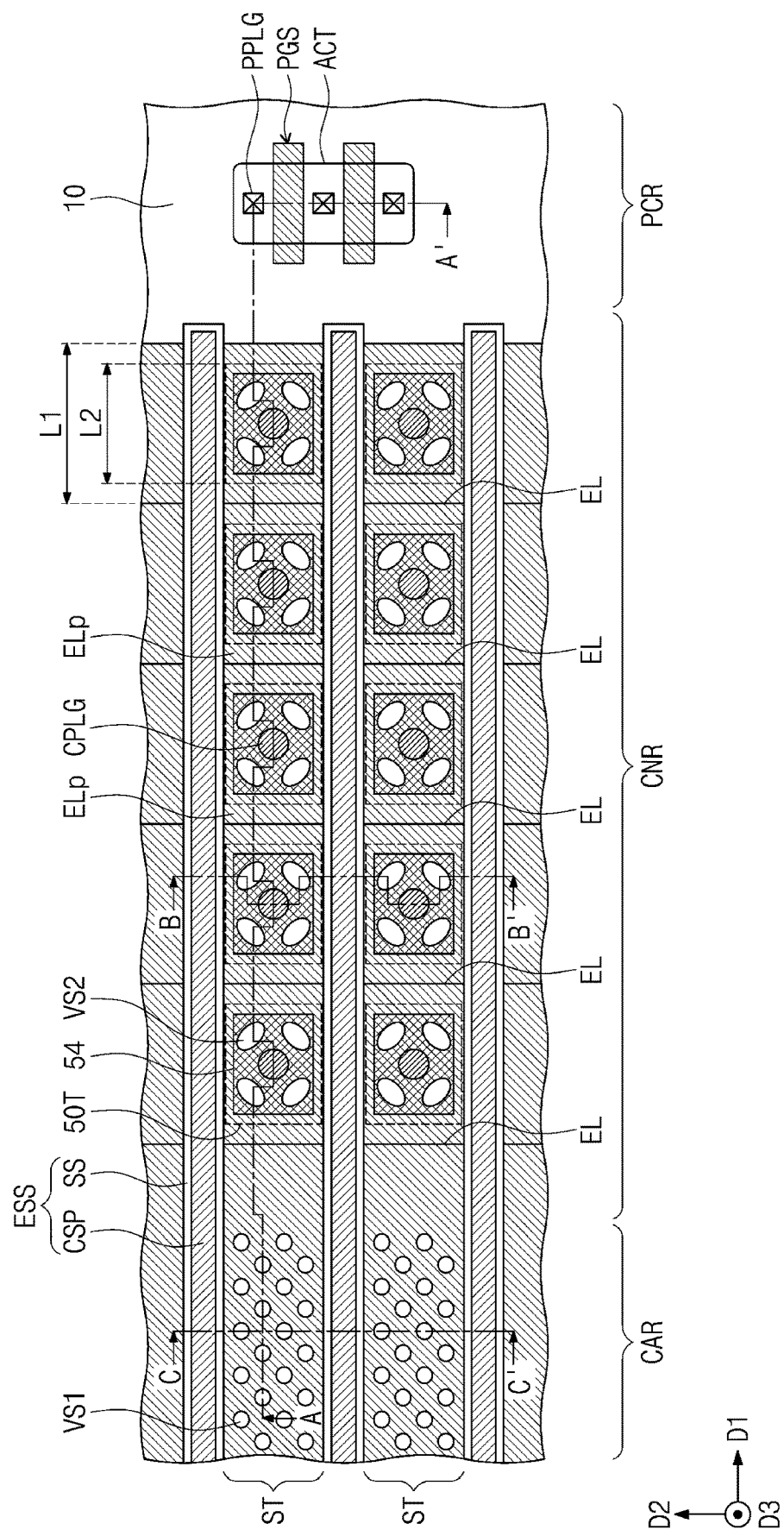
FIGS. 1A and 1B are plan views of a three-dimensional semiconductor memory device according to an embodiment of the inventive concept.
Figure 1B:
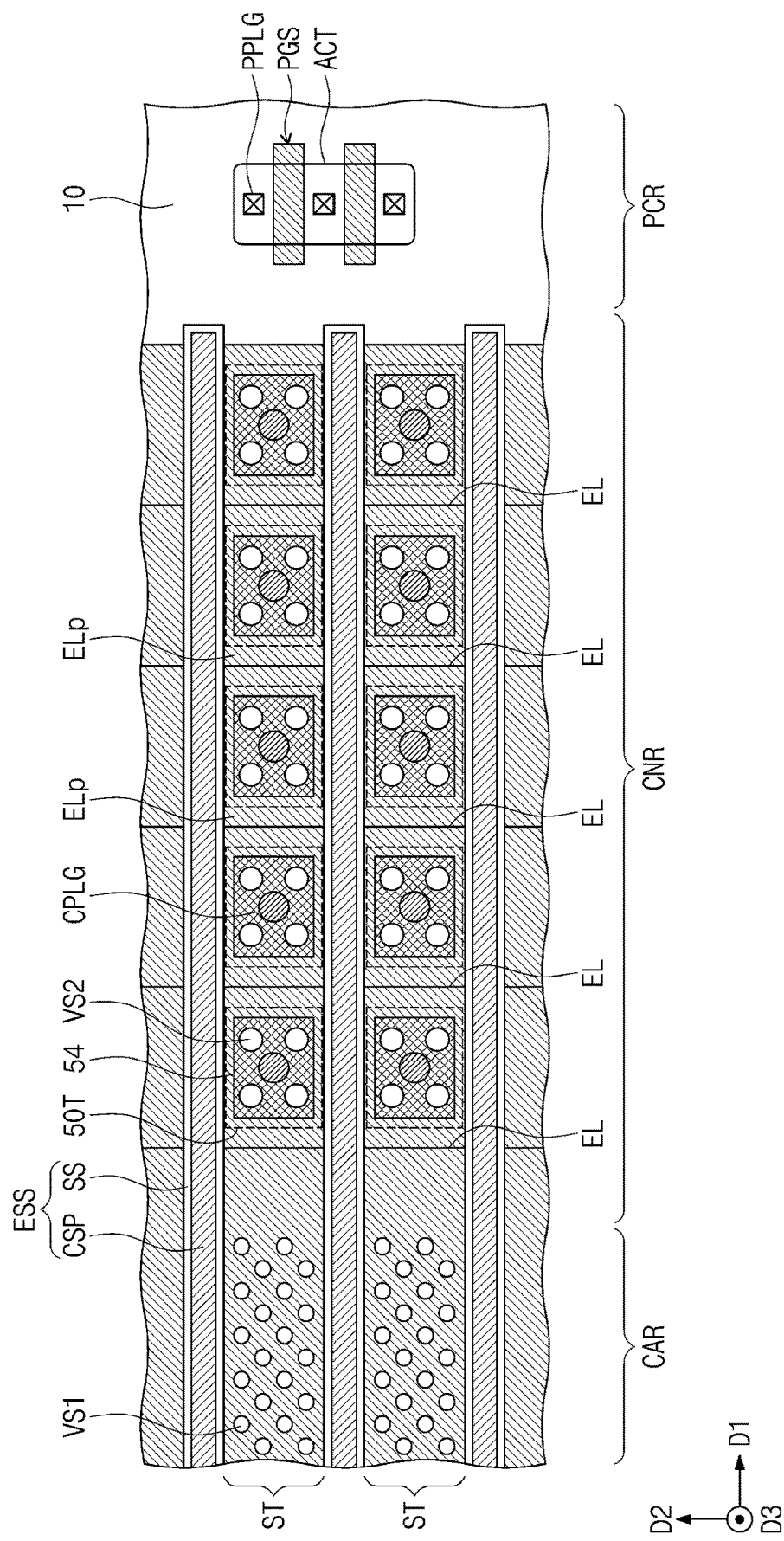
Figure 2A:
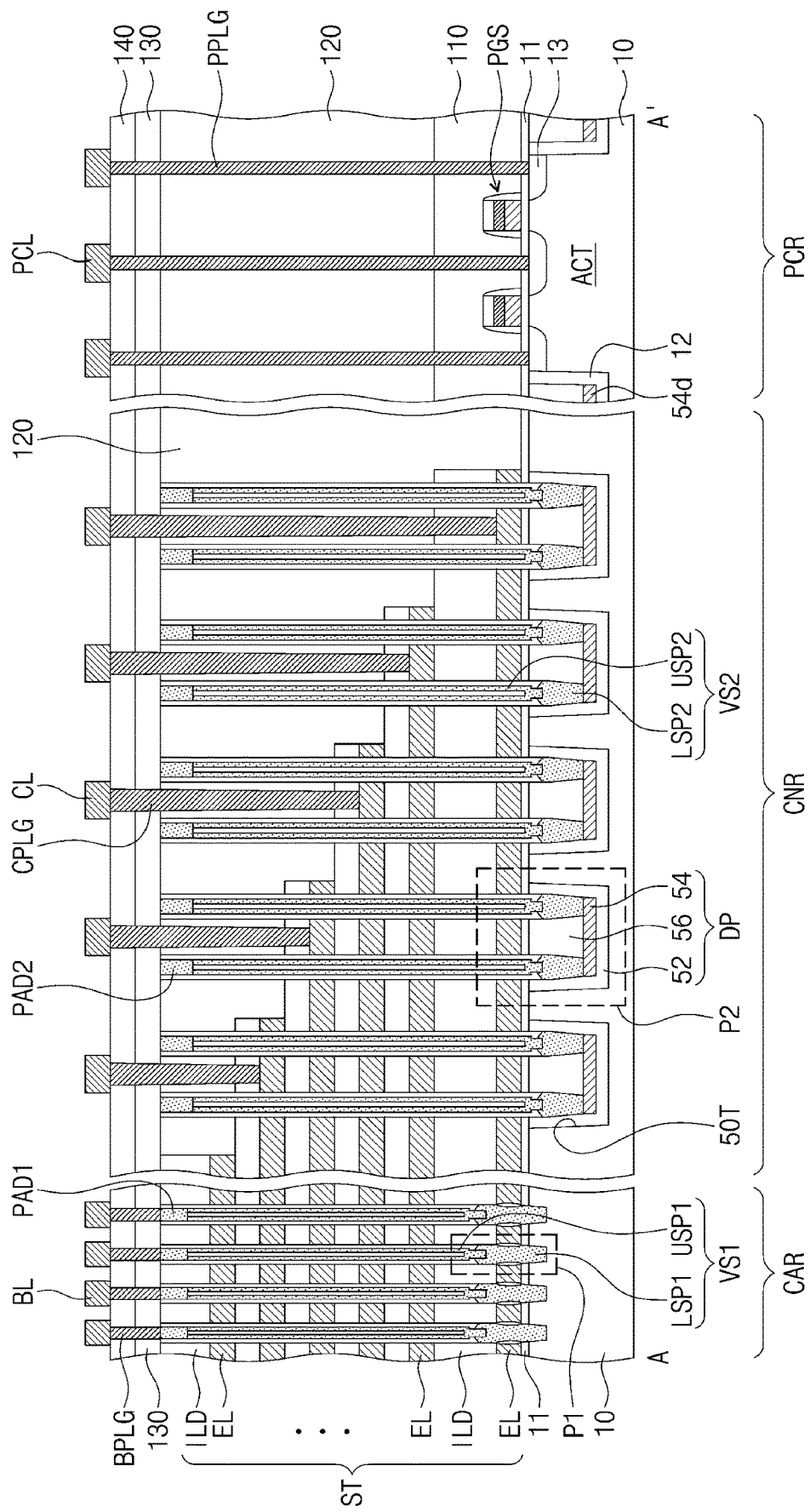
FIGS. 2A, 2B and 2C are sectional views taken along lines A-A', B-B', and C-C', respectively, of FIG. 1A that illustrate a three-dimensional semiconductor memory device according to an embodiment of the inventive concept.
Figure 2B:
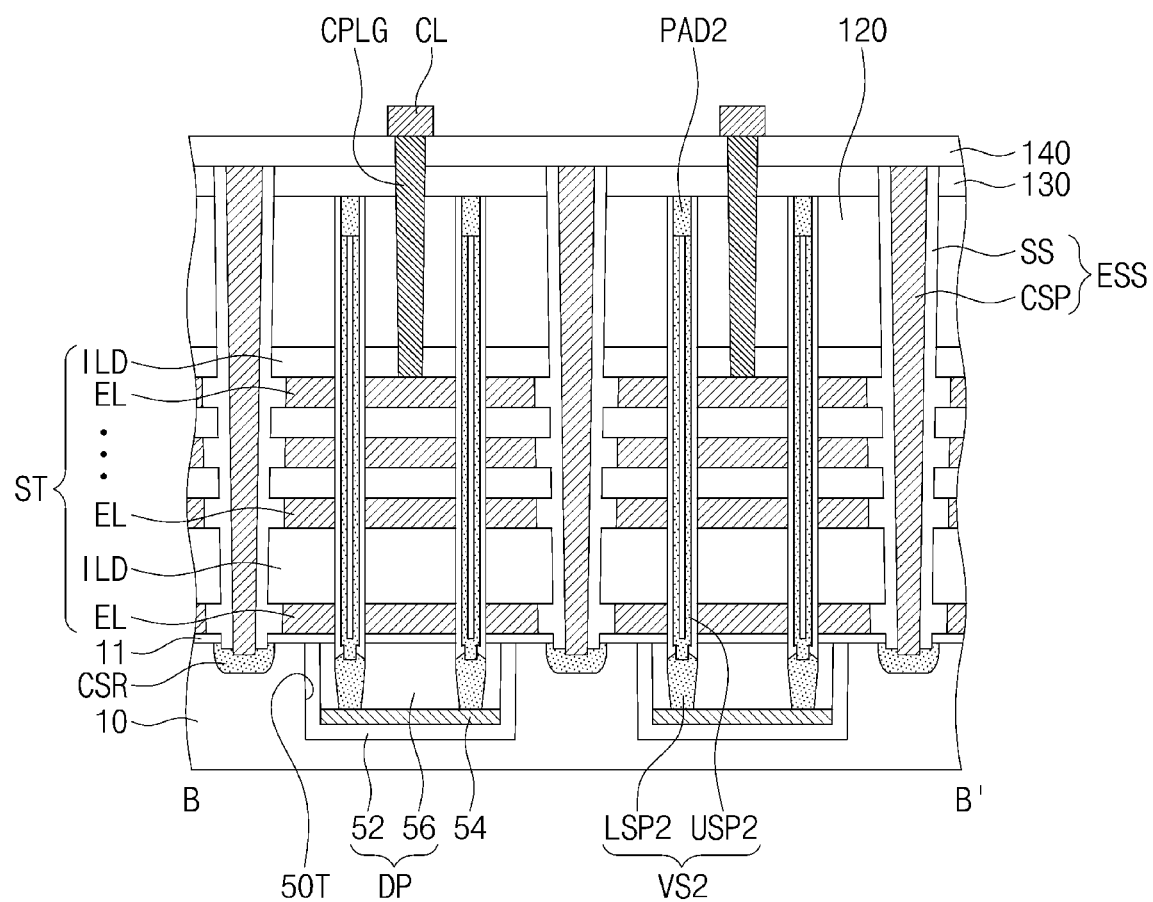
Figure 2C:
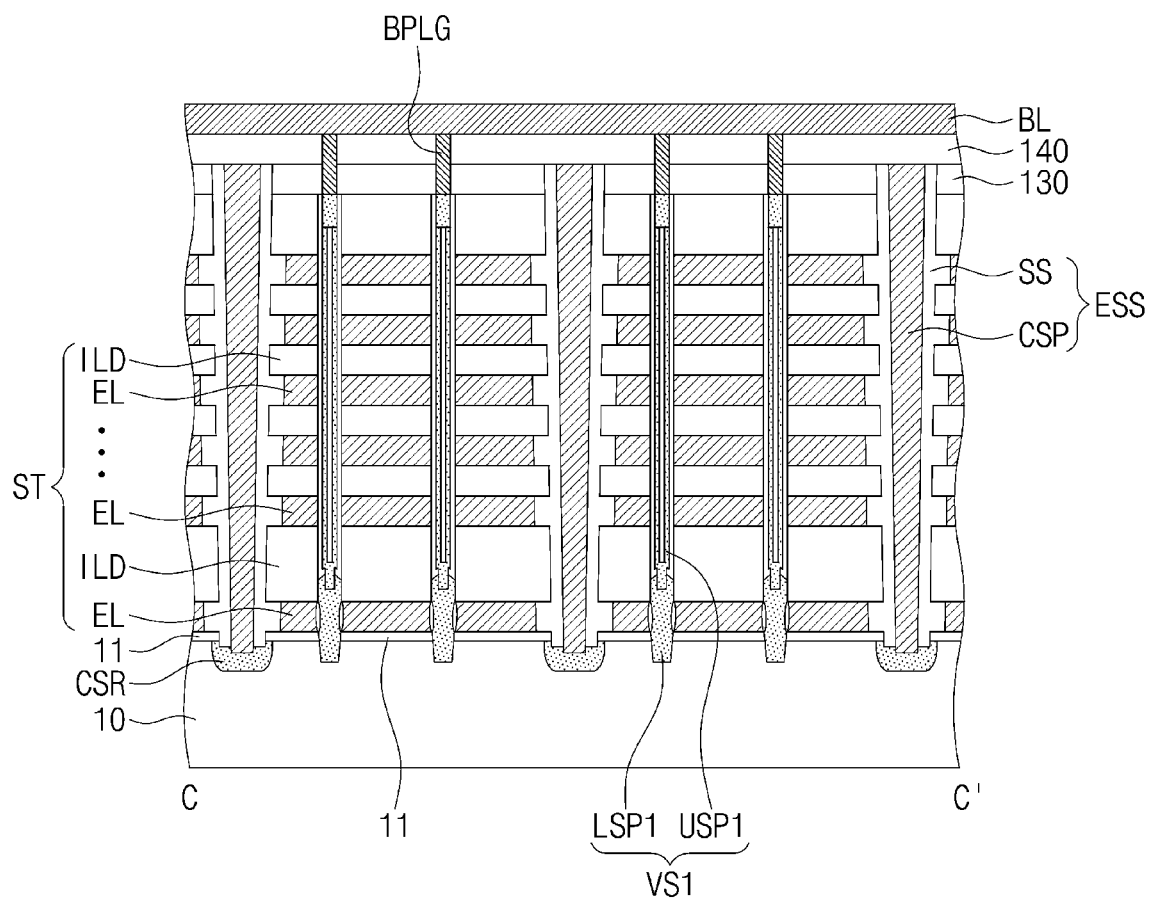
Figure 3A:
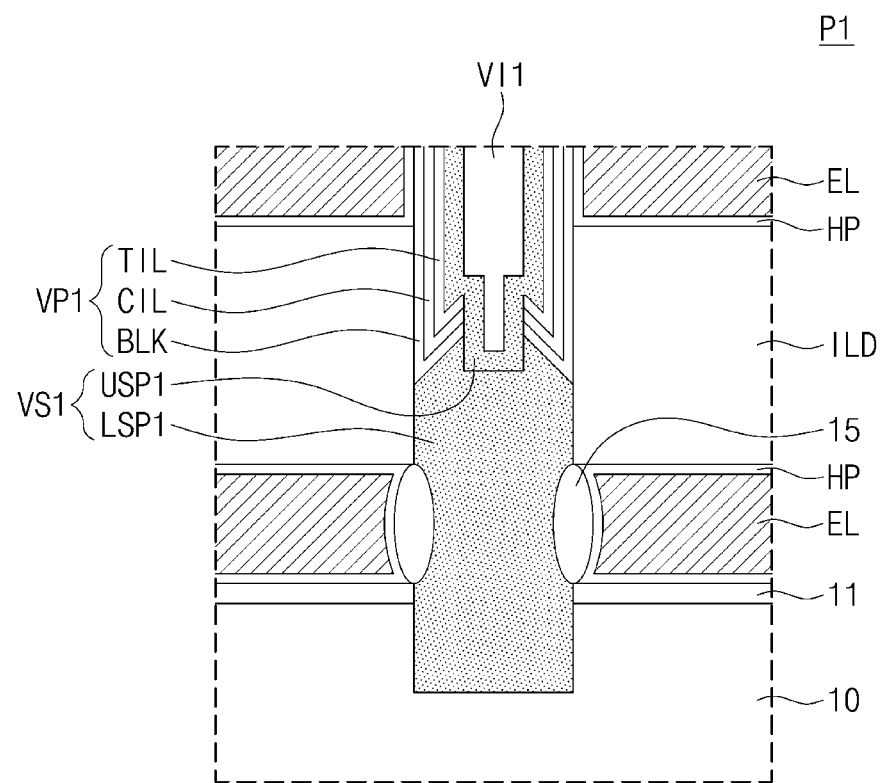
FIG. 3A is an enlarged sectional view illustrating a portion 'P1' of FIG. 2A.

FIGS. 1A and 1B are plan views of a three-dimensional semiconductor memory device according to an embodiment of the inventive concept. FIGS. 2A, 2B, and 2C are sectional views along lines A-A', B-B', and C-C', respectively, of FIG. 1A that illustrate a three-dimensional semiconductor memory device according to an embodiment of the inventive concept. FIG. 3A is an enlarged sectional view of a portion 'P1' of FIG. 2A.

Referring to FIGS. 1A, 2A, 2B, and 2C, according to an embodiment, a substrate 10 includes a cell array region CAR, a connection region CNR, and a peripheral circuit region PCR. The connection region CNR is positioned, between the cell array region CAR and the peripheral circuit region PCR. The substrate 10 includes at least one of a semiconductor material, such as silicon, an insulating material, such as glass, or a semiconductor or conductive material covered with azo insulating material. For example, the substrate 10 can be a silicon wafer, which is of a first conductivity type.

According to an embodiment, a peripheral circuit structure is provided on the peripheral circuit region PCR of the substrate 10, and the peripheral circuit structure includes peripheral logic circuits that write or read data to or from memory cells. The peripheral logic circuits include row and column decoders, a page buffer, and control circuits.

In detail, according to an embodiment, a device isolation pattern 12 is disposed in the peripheral circuit region PCR of the substrate 10 that defines a peripheral active region ACT. A peripheral gate stack PGS that crosses the peripheral active region ACT is disposed on the substrate 10. The peripheral gate stack PGS includes a peripheral gate insulating layer, a doped poly-silicon layer, a gate metal layer, and a hard mask layer, which are sequentially stacked on the substrate 10. A peripheral insulating layer 110 that covers the peripheral gate stack PGS is disposed on the peripheral circuit region PCR of the substrate 10.

According to an embodiment, a plurality of electrode structures ST extend in a direction from the cell array region CAR toward the connection region CNR or in a first direction D1 and are spaced apart from each other in a second direction D2. A buffer insulating layer 11 is disposed between the electrode structures ST and the substrate 10 and includes a silicon oxide layer.

According to an embodiment, each of the electrode structures ST includes electrodes EL and insulating layers ILD, which are alternately and repeatedly stacked in a third direction D3 perpendicular to a top surface of the substrate 10. The electrodes EL have substantially the same thickness, and thicknesses of the insulating layers ILD can vary depending on technical requirements for the semiconductor memory device. A thickness of each of the insulating layers ILD is less than that of each of the electrodes EL.

According to an embodiment, the electrode structures ST have a staircase structure on the connection region CNR. In detail, lengths of the electrodes EL in the first direction D1 decrease with increasing distance from the substrate 10, and heights of the electrode structures ST decrease with increasing distance from the cell array region CAR. In addition, side surfaces of the electrodes EL are spaced apart from each other by a first distance L1 in the first direction D1.

According to an embodiment, each of the electrodes EL has a pad portion ELp on the connection region CNR, and that corresponds to an end portion of each of the electrodes EL, and the pad portions ELp of the electrodes EL of the electrode structure ST have a staircase structure on the connection region CNR. The pad portions ELp are spaced apart from each other in horizontal and vertical directions. For example, the pad portions ELp are arranged in the first direction D1, and each of the pad portions ELp has a first length that corresponds to the first distance L1. In other words, when measured in the first direction D1, each of the electrodes EL is longer than electrode EL directly disposed thereon.

According to an embodiment, a planarized insulating layer 120 is disposed on the substrate 10. The planarized insulating layer 120 covers the electrode structures ST on the connection region CNR and has a substantially flat top surface. The planarized insulating layer 120 may include a single insulating layer or a plurality of stacked insulating layers. The planarized insulating layer 120 covers the staircase structure of the electrode structures ST and covers a peripheral circuit structure PSTR on the peripheral circuit region PCR. The planarized insulating layer 120 may include a single insulating layer or a plurality of stacked insulating layers and may include, for example, a silicon oxide layer or a low-k dielectric layer.

According to an embodiment of the inventive concept, the substrate 10 includes dummy trenches 50T formed on the connection region CNR, and dummy insulating structures DP are disposed in the dummy trenches 50T, respectively. Top surfaces of the dummy insulating structures DP are positioned at substantially the same level as the top surface of the cell array region CAR of the substrate 10. Bottom surfaces of the dummy insulating structures DP are positioned below the top surface of the cell array region CAR of the substrate 10.

According to an embodiment, the electrode structure ST extends from a top surface of the cell array region CAR of the substrate 10 to top surfaces of the dummy insulating structures DP of the connection region CNR. In other words, the dummy insulating structures DP are located below the staircase structure of the electrode structures ST.

For example, the dummy insulating structures DP are provided below the pad portions ELp of the electrodes EL, respectively. When measured in the first direction D1, each of the dummy insulating structures DP has a second length L2, which is shorter than the first length L1 of the pad portion ELp. In other words, the dummy insulating structures DP respectively overlap the pad portions ELp of the electrodes EL, when viewed in a plan view.

As shown in FIGS. 1A and 1B, according to an embodiment, the dummy insulating structures DP are spaced apart from each other in the first and second directions D1 and D2. The dummy insulating structures DP are located below the staircase structure of the electrode structures ST. Heights of the dummy insulating structures DP are substantially the same as the height of the device isolation pattern 12. In other words, bottom surfaces of the dummy insulating structures DP are positioned at substantially the same level as the bottom surface of the device isolation pattern 12.

According to an embodiment of the inventive concept, each of the dummy insulating structures DP includes an etch stop pattern 54 disposed in the dummy trench 50T, a dummy insulating pattern 52 that covers an inner surface of the dummy trench 50T and is interposed between the bottom surface of the etch stop pattern 54 and the substrate 10, and a buried insulating pattern 56 disposed between the top surface of the etch stop pattern 54 and the electrode structure ST and, that fills the dummy trench 50T. According to an embodiment the etch stop pattern 54 includes a material having an etch selectivity with respect to the dummy insulating pattern 52 and the buried insulating pattern 56. The etch stop pattern 54 is formed of or includes at least one of, for example, a poly-silicon layer, a silicon carbon layer, a silicon germanium layer, a metal layer, a metal nitride layer, or a metal silicide layer. The dummy insulating pattern 52 and the buried insulating pattern 56 are formed of an insulating material having an etch selectivity with respect to the etch stop pattern 54. The dummy insulating pattern 52 and the buried insulating pattern 56 are formed of or include at least one of, for example, a silicon oxide layer, a silicon oxynitride layer, or a silicon nitride layer.

According to an embodiment, the dummy insulating pattern 52 is in direct contact with the inner surface of the dummy trench 50T. The dummy insulating pattern 52 is interposed between the bottom surface of the etch stop pattern 54 and the substrate 10.

Figure 3B:
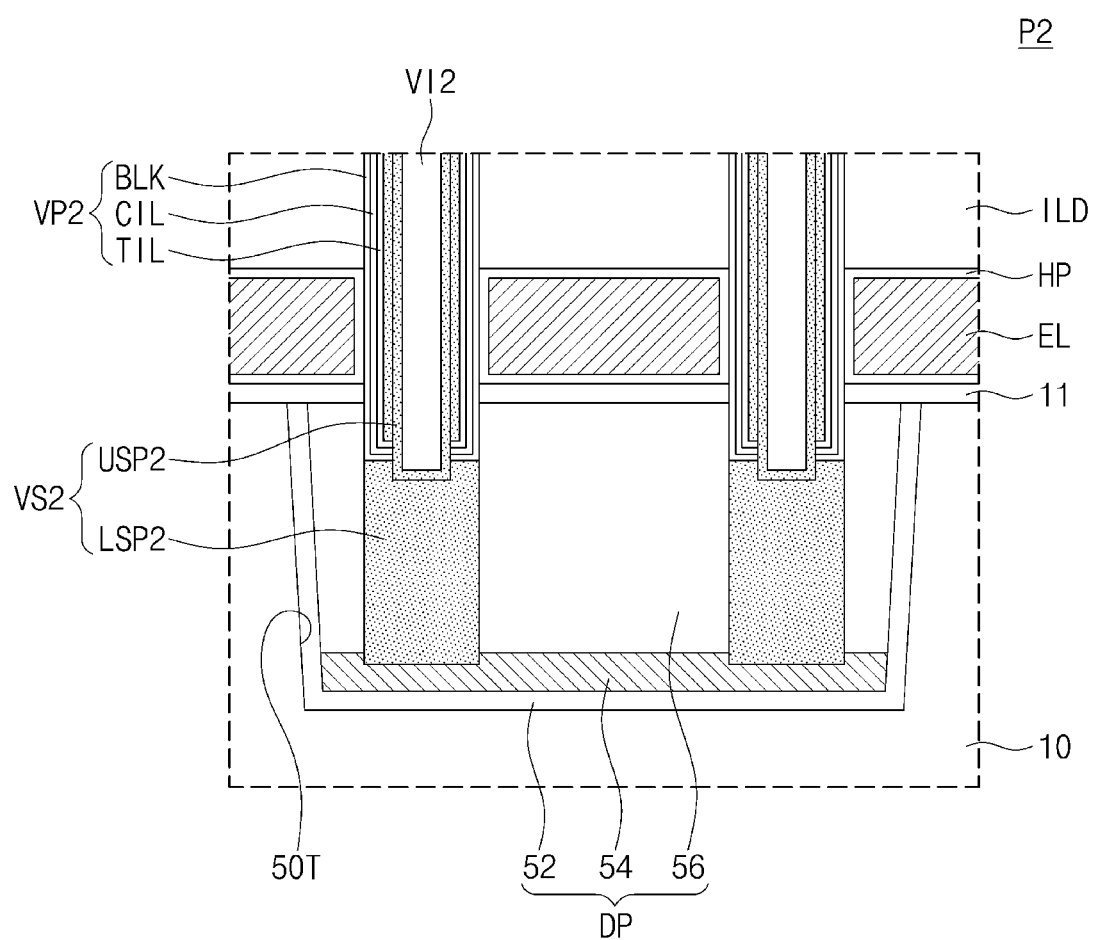

According to an embodiment, the etch stop pattern 54 is disposed in the dummy trench 50T with the dummy insulating pattern 52. The top surface of the etch stop pattern 54 is positioned below the top surface of the cell array region CAR of the substrate 10. The top surface of the etch stop patter 54 is parallel to the top surface of the substrate 10 and the etch stop pattern 54 has a plate shape, as shown in FIGS. 1A and 3B. Each of the etch stop patterns 54 overlaps the pad portion ELp of a corresponding electrode EL, when viewed in a plan view.

According to an embodiment, the buried insulating pattern 56 covers the top surface of the etch stop pattern 54 and makes contact with a portion of the dummy insulating pattern 52 that covers the side surface of the dummy trench 50T. A top surface of the buried insulating pattern 56 is positioned at substantially the same level as the top surface of the cell array region CAR of the substrate 10.

Figure 3C:
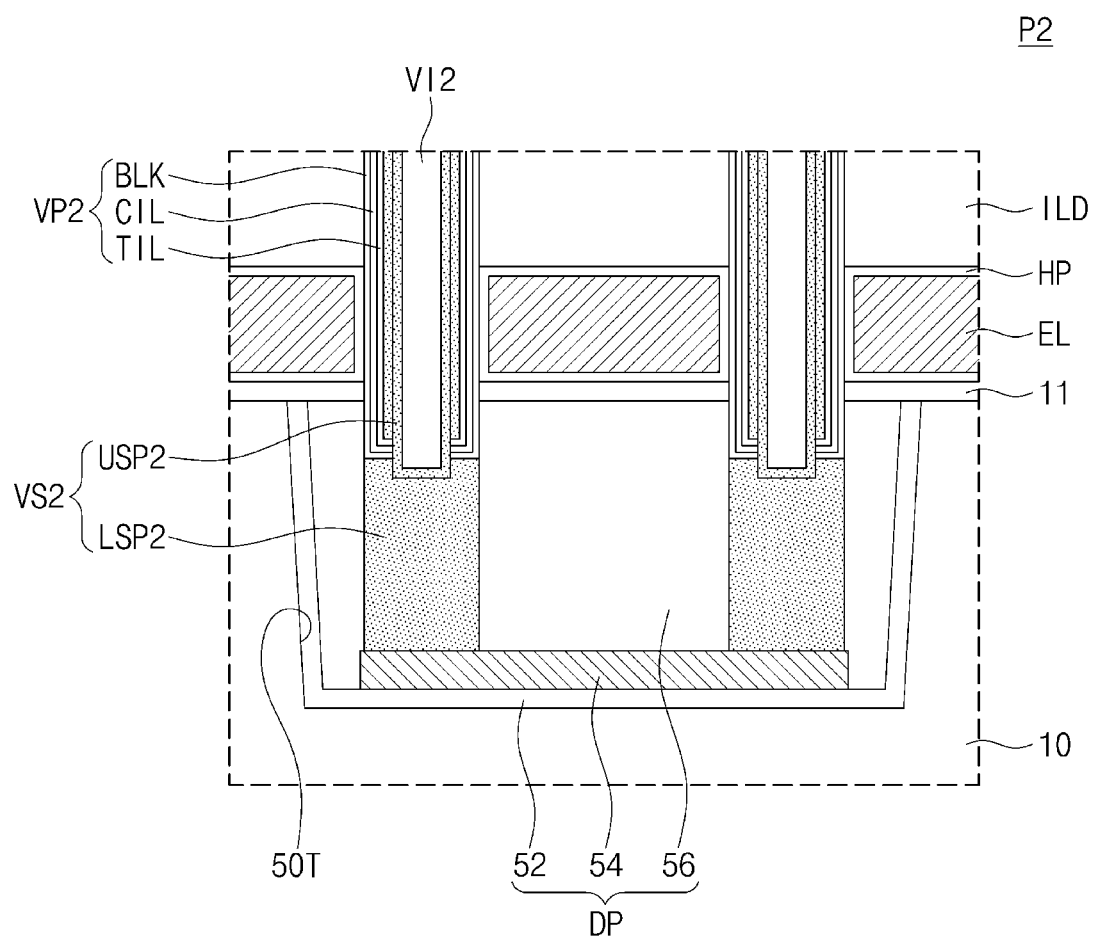

According to an embodiment, the etch stop pattern 54 is spaced apart from the substrate 10 and the electrode structure ST by the dummy insulating pattern 52 and the buried insulating pattern 56. According to an embodiment of the inventive concept, a dummy pattern 54d formed of the same material as the etch stop pattern 54 is disposed on the peripheral circuit region PCR and in the device isolation pattern 2. In an embodiment, the dummy pattern 54d may be omitted. Referring to FIG. 3C, the etch stop pattern 54 is disposed between the dummy insulating pattern 52 and the buried insulating pattern 56, and a side surface of the etch stop pattern 54 is spaced apart from the dummy insulating pattern 52. A portion of the buried insulating pattern 56 is disposed between the side surface of the etch stop pattern 54 and the dummy insulating pattern 52.

Figure 3D:
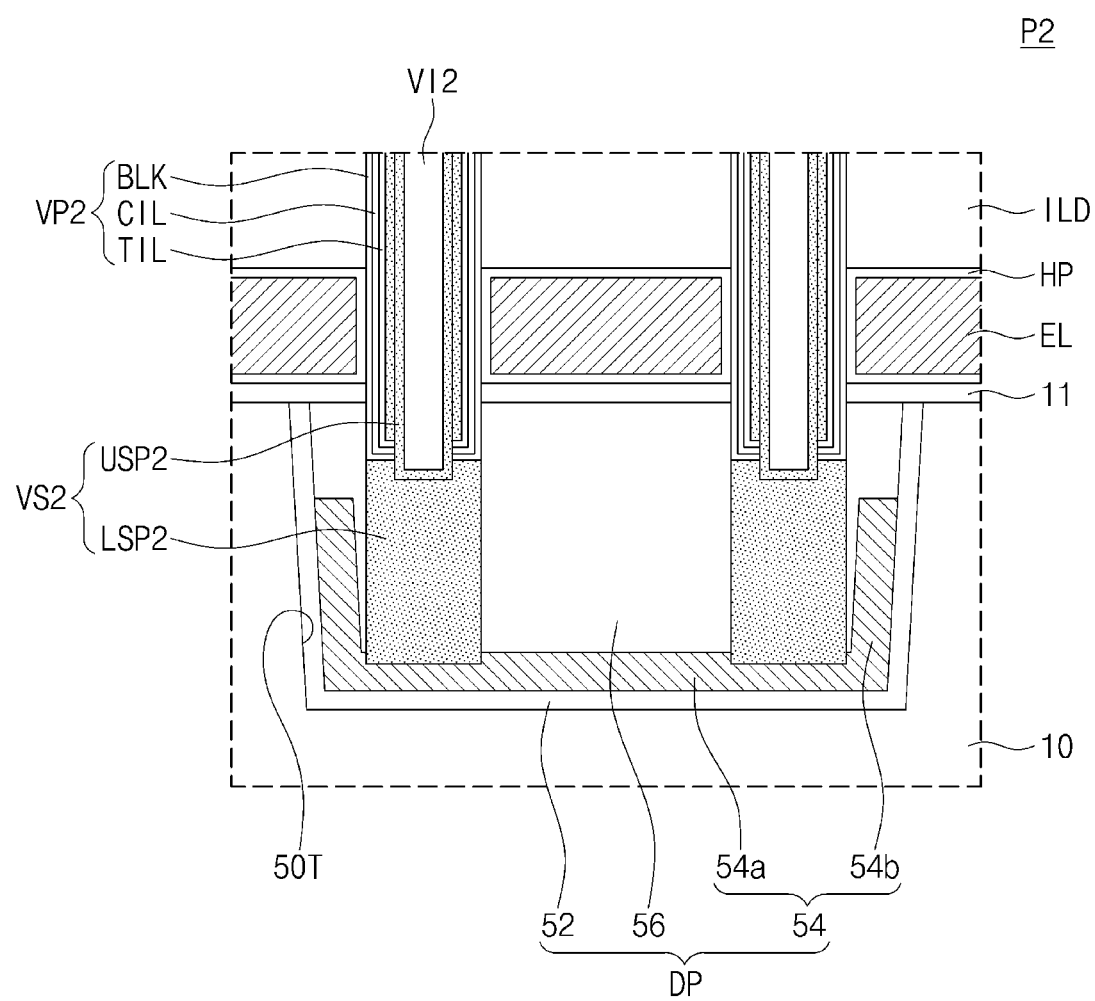

Referring to FIG. 3D, according to an embodiment, the etch stop pattern 54 includes a bottom portion 54a disposed on the dummy insulating pattern 52 and parallel to the top surface of the substrate 10, and a sidewall portion 54b that extends vertically upward from the bottom portion 54a along the side surface of the dummy trench 50T. The dummy insulating pattern 52 is disposed between the sidewall portion 54b of the etch stop pattern 54 and the inner sidewall of the dummy trench 50T, and a top surface of the sidewall portion 54b of the etch stop pattern 54 is positioned below the top surface of the cell array region CAR of the substrate 10.

Figure 3E:
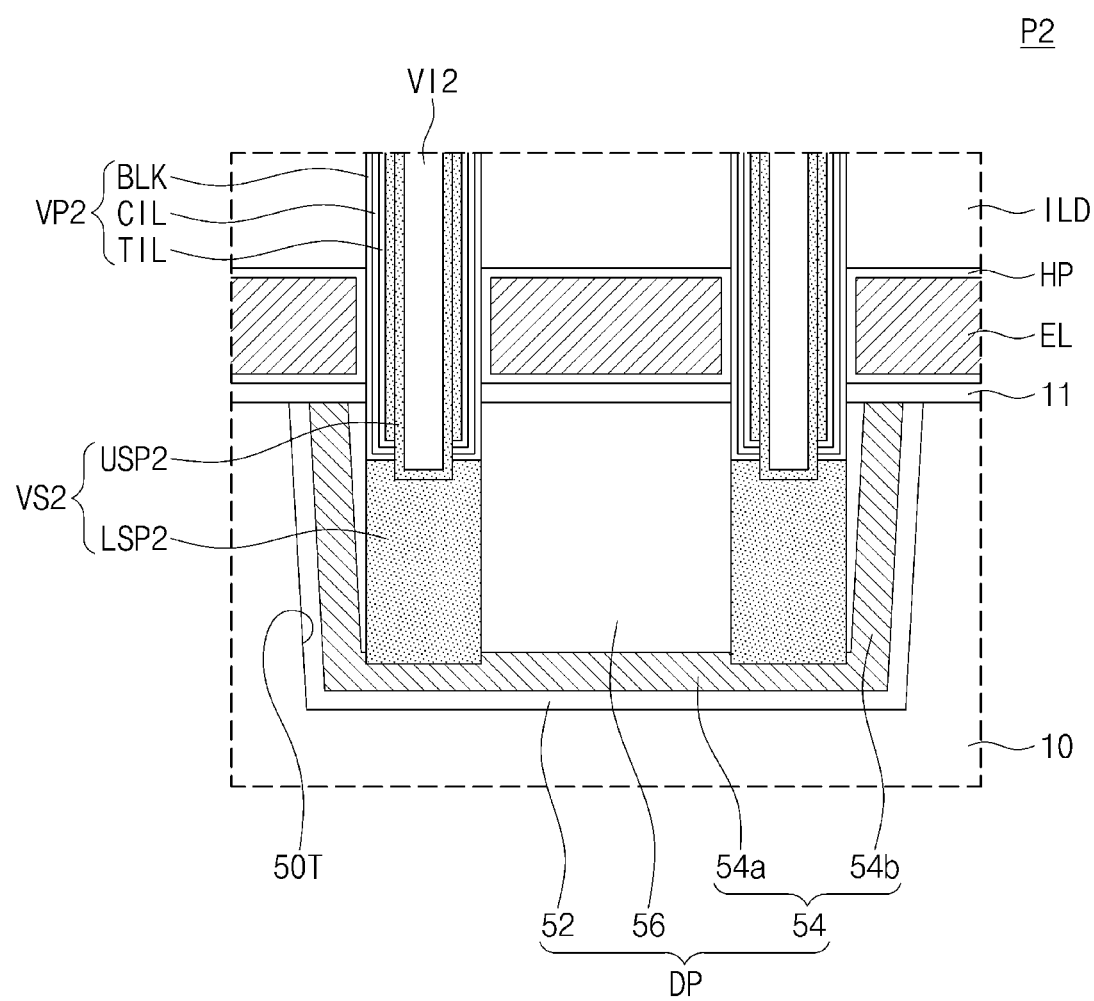

Referring to FIG. 3E, according to an embodiment, the etch stop pattern 54 includes the bottom portion 54a disposed on the dummy insulating pattern 52 and parallel to the top surface of the substrate 10, and the sidewall portion 54b that extends vertically upward from the bottom portion 54a, and has a protruding shape. Here, a top surface of the sidewall portion 54b of the etch stop pattern 54 is positioned at substantially the same level as a top surface of the dummy insulating pattern 52 and a top surface of the buried insulating pattern 56.

Referring back to FIGS. 1A, 2A, 2B, and 2C, according to an embodiment, a plurality of cell channel structures VS1 are disposed that penetrate each of the electrode structures ST on the cell array, region CAR and connect to the substrate 10. When viewed in a plan view, the cell channel structures VS1 arranged in the first direction D1 have a zigzag arrangement. The cell channel structures VS1 have a circular top surface.

According to an embodiment, the cell channel structures VS1 include a semiconductor material, such as silicon (Si) or germanium (Ge), or mixtures thereof. In addition, the cell channel structures VS1 are formed of or include a doped semiconductor material or an intrinsic semiconductor material. The cell channel structures VS1 are used as channel regions of memory cell transistors, which constitute cell strings of a vertical NAND FLASH memory device.

In an embodiment, each of the cell channel structures VS1 includes a first lower semiconductor pattern LSP1 and a first upper semiconductor pattern USP1.

In detail, according to an embodiment, referring to FIG. 3A, the first lower semiconductor pattern LSP1 makes direct contact with the substrate 10 and includes a pillar-shaped epitaxial layer grown from the substrate 10.

According to an embodiment, the first lower semiconductor pattern LSP1 is formed of or includes at least one of silicon (Si), germanium (Ge), silicon-germanium (SiGe), III-V semiconductor compounds, or II-VI semiconductor compounds. The first lower semiconductor pattern LSP1 may be an undoped pattern or may be a doped pattern that has the same conductivity type as the substrate 10.

According to an embodiment, the first lower semiconductor pattern LSP1 has a first height in the third direction D3 and the first height is greater than a thickness of the lowermost electrode EL. The first lower semiconductor pattern LSP1 has a top surface that is positioned above a top surface of the lowermost electrode EL of the electrode structure ST. The top surface of the first lower semiconductor pattern LSP1 is positioned below a top surface of the lowermost insulating layer ILD disposed on the lowermost electrode EL.

According to an embodiment, a gate insulating layer 15 is disposed on a portion of a side surface of the first lower semiconductor pattern LSP1. The gate insulating layer 15 is disposed between the lowermost electrode EL and the first lower semiconductor pattern LSP1. The gate insulating layer 15 includes a silicon oxide layer, such as a thermally-grown oxide layer. The gate insulating layer 15 has a rounded side surface.

According to an embodiment, the first upper semiconductor pattern USP1 makes direct contact with the first lower semiconductor pattern LSP1 and has a bottom-closed pipe or a 'U'-shape. The first upper semiconductor pattern USP1 encloses an internal space that is filled with an insulating pattern VI1 that includes an insulating material.

According to an embodiment, the first upper semiconductor pattern USP1 has a bottom surface positioned below the top surface of the first lower semiconductor pattern LSP1. The first upper semiconductor pattern USP1 may be formed of or includes an undoped semiconductor material or a doped semiconductor material having substantially the same conductivity type as the substrate 10. The first upper semiconductor pattern USP1 has a different crystal structure from the first lower semiconductor pattern LSP1 and includes at least one of for example, single- or poly-crystalline or amorphous structures. A bit line conductive pad PAD1 coupled with a bit line contact plug BPLG is disposed on a top portion of the cell channel structures VS1, a top portion of the first upper semiconductor pattern USP1.

According to an embodiment, a first vertical insulating pattern VP1 is disposed between the electrode structure ST and the first upper semiconductor pattern USP1. The first vertical insulating pattern VP1 extends in the third direction D3 and surrounds the side surface of the first upper semiconductor pattern USP1. In other words, the first vertical insulating pattern VP1 is shaped like a pipe that has open top and bottom portions.

In detail, according to an embodiment, referring to FIGS. 2A, 2C, and 3A, the first vertical insulating pattern VP1 makes contact with a portion of the top surface of the first lower semiconductor pattern LSP1. A bottom surface of the first vertical insulating pattern VP1 is positioned above the bottom surface of the first upper semiconductor pattern USP1.

According to an embodiment, the first vertical insulating pattern VP1 includes one or more layers. In some embodiments, the first vertical insulating pattern VP1 is a data storage layer of a NAND FLASH memory device and includes a tunnel insulating layer TIL, a charge storing layer CIL, and a blocking insulating layer BLK. For example, the charge storing layer CIL may be a trap insulating layer, a floating gate electrode, or an insulating layer with conductive nano dots. In detail, the charge storing layer CIL includes at least one of a silicon nitride layer, a silicon oxynitride layer, a silicon-rich nitride layer, a nanocrystalline silicon layer, or a laminated trap layer. The tunnel insulating layer TIL is formed of at least one material whose band gaps are greater than those of the charge storing layer CIL, and the blocking insulating layer BLK is formed of a high-k dielectric material, such as aluminum oxide or hafnium oxide. In an embodiment, the first vertical insulating pattern VP1 is used as a memory element of a phase-change memory device or a variable resistance memory and, includes a phase-change or a variable-resistance layer.

Referring back to FIGS. 1A, 2A, 2B, and 2C, according to an embodiment, a plurality of dummy channel structures VS2 are disposed that penetrate the planarized insulating layer 120, the electrode structures ST, and a portion of the dummy insulating structure DP on, the connection region CNR. Bottom surfaces of the dummy channel structures VS2 are positioned below bottom surfaces of the cell channel structures VS1. Top surfaces (If the dummy channel structures VS2 are positioned at substantially the same level as top surfaces of the cell channel structures VS1. The dummy channel structures VS2 are formed of or include the same semiconductor material as the cell channel structures VS1. A width or diameter of the dummy channel structures VS2 is greater than those of cell channel structures VS1. Top surfaces of the etch stop patterns 54 are positioned at a level below that of bottom surfaces of the cell channel structures VS1.

In more detail, according to an embodiment, the dummy channel structures VS2 penetrate the staircase structure of the electrode structure ST, and the number of the electrodes EL that intersect each of the dummy channel structures VS2 decreases with decreasing distance from the peripheral circuit region PCR. The dummy channel structures VS2 are arranged in the first and second directions D1 and D2, when viewed in a plan view, and penetrate the pad portions ELp of the electrodes EL on the connection region CNR.

According to an embodiment, a plurality of the dummy channel structures VS2 penetrate the pad portion ELp of each electrode EL. The plurality of dummy channel structures VS2 that penetrate the pad portion ELp of each electrode EL enclose each of a plurality of cell contact plugs CPLG, when viewed in a plan view. An example is illustrated in which four dummy channel structures VS2 penetrate the pad portion ELp of each electrode EL, but embodiments of the inventive concept are not limited thereto. For example, one, two, three, five, or six dummy channel structures VS2 may penetrate the pad portion ELp of each electrode EL. Furthermore, some of the dummy channel structures VS2 may penetrate sidewalls of the electrodes EL, when viewed in a plan view.

According to an embodiment of the inventive concept, top widths of the dummy channel structures VS2 are greater than top widths of the cell channel structures VS1. For example, referring to FIG. 1A, each of the dummy channel structures VS2 may have an elliptical surface with long and short axes or a bar-shaped top surface. A width of a major axis of the top surface of each of the dummy channel structures VS2 is greater than a width of a minor axis. The long axes of the dummy channel structures VS2 are parallel to a direction that is inclined or diagonal with respect to the first and second directions D1 and D2 or may be disposed in different directions. In an embodiment, in the pad portion ELp of each electrode EL, a distance between the dummy channel structures VS2 in the first direction D1 is greater than a distance between the dummy channel structures VS2 in the second direction D2. In an embodiment, as shown in FIG. 1B, each of the dummy channel structures VS2 has a circular top surface, similar to the cell channel structures VS1.

According to an embodiment of the inventive concept, the major axis of the top surface of the dummy channel structure VS2 has a first length and the minor axis thereof has a first width less than the first length, and the top surface of the cell channel structure VS1 has a second width less than the first width. The greatest width of the top surface of the cell channel structure VS1 is less than the first width, which corresponds to the minimum width of the dummy channel structure VS2.

In an embodiment, the dummy channel structures VS2 penetrate portions of the dummy insulating structures DP and make contact with the etch stop pattern 54. In other words, the dummy channel structures VS2 are spaced apart from the substrate 10 by the dummy insulating structures DP.

In more detail, referring to FIGS. 3B, 3C, and 3D, according to an embodiment, each of the dummy channel structures VS2 includes a second lower semiconductor pattern LSP2 and a second upper semiconductor pattern USP2.

According to an embodiment, the second lower semiconductor patterns LSP2 penetrate the buried insulating pattern 56 and make direct contact with the etch stop pattern 54. For example, a bottom surface of the second lower semiconductor pattern LSP2 may be positioned between the top and bottom surfaces of the etch stop pattern 54. A side surface of the second lower semiconductor pattern LSP2 is spaced apart from the dummy trenches 50T and in contact with the buried insulating pattern 56.

According to an embodiment, when measured in the third direction D3, the second lower semiconductor pattern LSP2 have a second height less than a first height of a first lower semiconductor pattern LSP1. A top surface of the second lower semiconductor pattern LSP2 is positioned below a bottom surface of the lowermost electrode EL of the electrode structure ST. The second lower semiconductor pattern LSP2 includes a pillar-shaped epitaxial layer formed of semiconductor material and grown from the etch stop pattern 54. The second lower semiconductor pattern LSP2 includes the same semiconductor material as the first lower semiconductor pattern LSP1. According to an embodiment, the second lower semiconductor pattern LSP2 has a different crystal structure from the first lower, semiconductor pattern LSP1. For example, the first lower semiconductor pattern LSP1 has a single crystalline structure, whereas the second lower semiconductor pattern LSP2 has a polycrystalline structure.

According to an embodiment, the second upper semiconductor pattern USP2 makes direct contact with the second lower semiconductor pattern LSP2 and has a bottom-closed pipe or a 'U'-shape. The second upper semiconductor pattern USP2 encloses an internal space that is filled with an insulating pattern VI2 that includes an insulating material. The second upper semiconductor pattern USP2 has a bottom surface positioned below that of the lowermost electrode EL and is positioned below the top surface of the second lower semiconductor pattern LSP2. The second upper semiconductor pattern USP2 is formed of or includes the same semiconductor material as the first upper semiconductor pattern USP1. Dummy conductive pads PAD2 are disposed on top portions of the dummy channel structures VS2, such as top portions of the second upper semiconductor patterns USP2, and have substantially the same structure as the bit line conductive pad PAD1.

According to an embodiment, a second vertical insulating pattern VP2 is disposed between the electrode structure ST and the second upper semiconductor pattern USP2. The second vertical insulating pattern VP2 extends in the third direction D3 such that a portion of the second vertical insulating pattern VP2 is interposed between the buried insulating pattern 56 and the second upper semiconductor pattern USP2. The second vertical insulating pattern VP2 has a pipe shape with open top and bottom portions, similar to the first vertical insulating pattern VP1.

According to an embodiment, the second vertical insulating pattern VP2 make contact with a portion of the top surface of the second lower semiconductor pattern LSP2. A bottom surface of the second vertical insulating pattern VP2 is positioned below the bottom surface of the lowermost electrode EL.

According to an embodiment, similar to the first vertical insulating pattern VP1, the second vertical insulating pattern VP2 include one or more layers. In an embodiment, the second vertical insulating pattern VP2 includes the tunnel insulating layer TIL, the charge storing layer CIL, and the blocking insulating layer BLK and is used as a data storing layer of a NAND FLASH memory device.

Furthermore, according to an embodiment, referring to FIGS. 3A and 3B, a horizontal insulating pattern HP is disposed between side surfaces of the electrodes EL and the first vertical insulating pattern VP1 and between the side surfaces of the electrodes EL and the second vertical insulating pattern VP2. The horizontal insulating pattern. HP covers side surfaces of the electrodes EL adjacent to the cell and dummy channel structures VS1 and VS2 and top and bottom surfaces of the electrodes EL. In addition, the horizontal insulating pattern HP includes a first portion along a side of the first lower semiconductor pattern LSP1 and between the gate insulating layer 15 and the lowermost electrode EL, and a second portion that extends from the first portion and that covers the top and bottom surfaces of the lowermost electrode EL. The horizontal insulating pattern HP is a portion of the data storing layer of the NAND FLASH memory device and includes the charge storing layer and the blocking insulating layer. Alternatively, the horizontal insulating pattern HP includes the blocking insulating layer.

Furthermore, according to an embodiment referring to FIGS. 1A, 2A, 2B, and 2C, electrode separation structures ESS are disposed on the substrate 10 and extend in the first direction D1 or parallel to the electrode structures ST. Each of the electrode separation structures ESS include a common source plug CSP and a sidewall spacer SS, which is disposed between the electrode structures ST and the common source plug CSP. Common source regions CSR are disposed under the common source plug CSP and extend in the first direction D1 and are spaced apart from each other in the second direction D2. The electrode structure and the etch stop pattern are disposed between adjacent electrode separation structures.

According to an embodiment, the common source plug CSP is disposed between the electrode structures ST and is coupled with the common source region CSR. For example, the common source plug CSP extends in the third direction D3 and has a substantially uniform upper width. In other words, the sidewall spacer SS is interposed between the common source plug CSP and both side surfaces of the electrode structures ST. Alternatively, the common source plug CSP penetrates the sidewall spacer SS and is locally coupled to the common source region CSR.

According to an embodiment, the cell contact plugs CPLG are disposed on the connection region CNR and penetrate a first interlayered insulating layer 130 and the planarized insulating layer 120 and are coupled to the pad portions ELp of the electrodes EL, respectively. Vertical lengths of the cell contact plugs CPLG decrease with decreasing distance from the cell array region CAR. In an embodiment, the cell contact plugs CPLG have top surfaces that are substantially coplanar with each other.

According to an embodiment, peripheral contact plugs PPLG are disposed on the peripheral circuit region PCR and penetrate the first interlayered insulating layer 130 and the planarized insulating layer 120 and are electrically connected to the peripheral logic circuits. A second interlayered insulating layer 140 is disposed on the first interlayered insulating layer 130 and covers a top surface of the common source plug CSP.

According to an embodiment, bit lines BL are disposed on the second interlayered insulating layer 140 and extend in the second direction D2. The bit lines BL are electrically connected to the cell channel structures VS1 via the bit line contact plugs BPLG.

According to an embodiment, connection lines CL are disposed on the second interlayered insulating layer 140 of the connection region CNR and extend in the first direction D1, and peripheral lines PCL are disposed on the second interlayered insulating layer 140 of the peripheral circuit region PCR and extend in the first direction D1. The connection lines CL are connected, to the cell contact plugs. CPLG through connection contact plugs CCP that penetrate the second interlayered insulating layer 140. The peripheral lines PCL are connected to the peripheral contact plugs PPLG through peripheral connection contact plugs PCP that penetrate the second interlayered insulating layer 140.

According to an embodiment of the inventive concept, on the connection region CNR, the dummy channel structures VS2 are separated from the substrate 10 by the etch stop pattern 54, and thus, it is possible to prevent an electric short circuit from forming between the cell contact plug CPLG and the substrate 10 through the dummy Channel structures VS2.

For a concise description, the same elements as that in a three-dimensional semiconductor memory device described with reference to FIGS. 1A, 2A, 2B, and 2C may be identified by similar or identical reference numbers without repeating an overlapping description thereof.

Figure 4A:
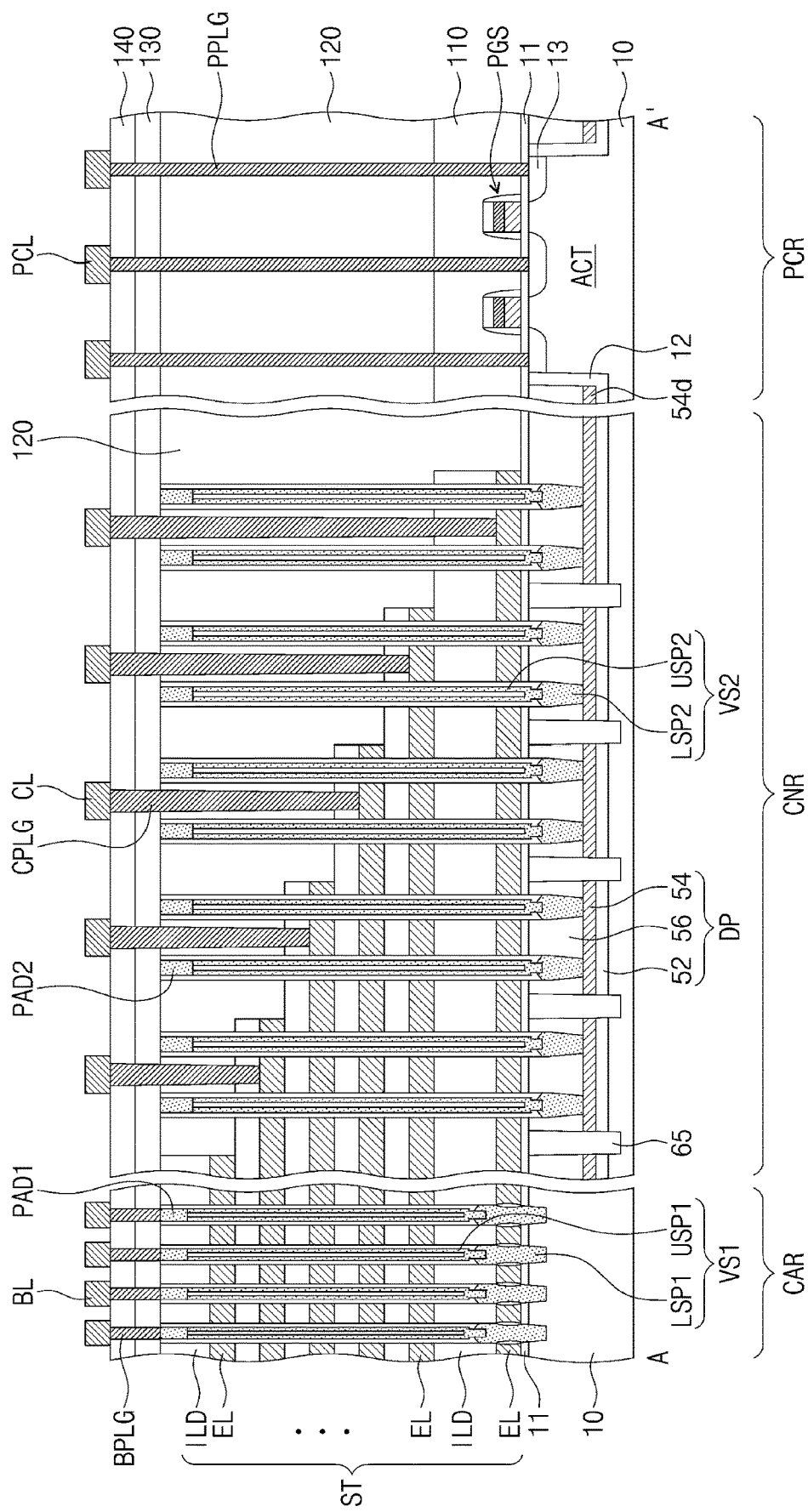
FIGS. 4A and 4B are sectional views taken along lines A-A' and B-B' respectively, of FIG. 1A that illustrate a three-dimensional semiconductor memory device according to an embodiment of the inventive concept.
Figure 4B:
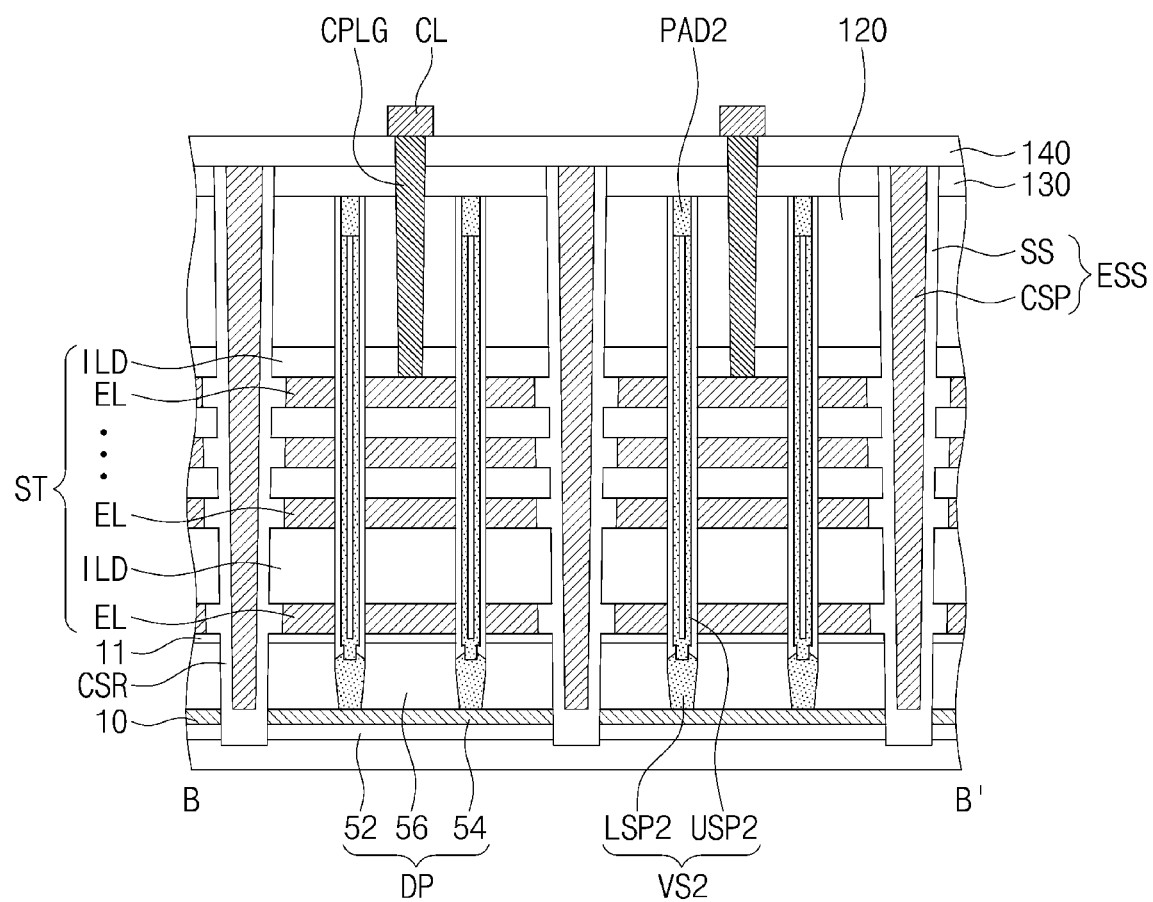

FIGS. 4A and 4B are sectional views taken along lines A-A' and B-B', respectively, of FIG. 1A that illustrate a three-dimensional semiconductor memory device according to an embodiment of the inventive concept.

Referring to FIGS. 4A and 4B, according to an embodiment, the dummy insulating structures DP are disposed under the pad portions ELp, respectively, of the electrodes EL, and between separation patterns 65 that extend in the first direction D1. Each of the separation patterns 65 is disposed between a corresponding pair of the dummy insulating structures DP. A top surface of the separation patterns 65 are substantially coplanar with top surfaces of the buried insulating patterns 56, and that the separation patterns 65 penetrate through the etch stop pattern 54 and the dummy insulating pattern 52 so that a bottom surface of the separation patterns 65 is positioned below the bottom surface of the dummy insulating pattern 52.

According to an embodiment, the dummy insulating structures DP are spaced apart from each other in the second direction D2 by the electrode separation structures ESS. For example, the electrode separation structures ESS are disposed on the connection region CNR and penetrate the planarized insulating layer 120, and the sidewall spacer SS is disposed between the common source plug CSP and the dummy insulating structure DP.

According to an embodiment, the dummy insulating structures DP are disposed on the etch stop pattern 54, and the top surface of the second lower semiconductor pattern LSP2 is positioned below the top surface of the cell array region CAR of the substrate 10.

Figure 5:
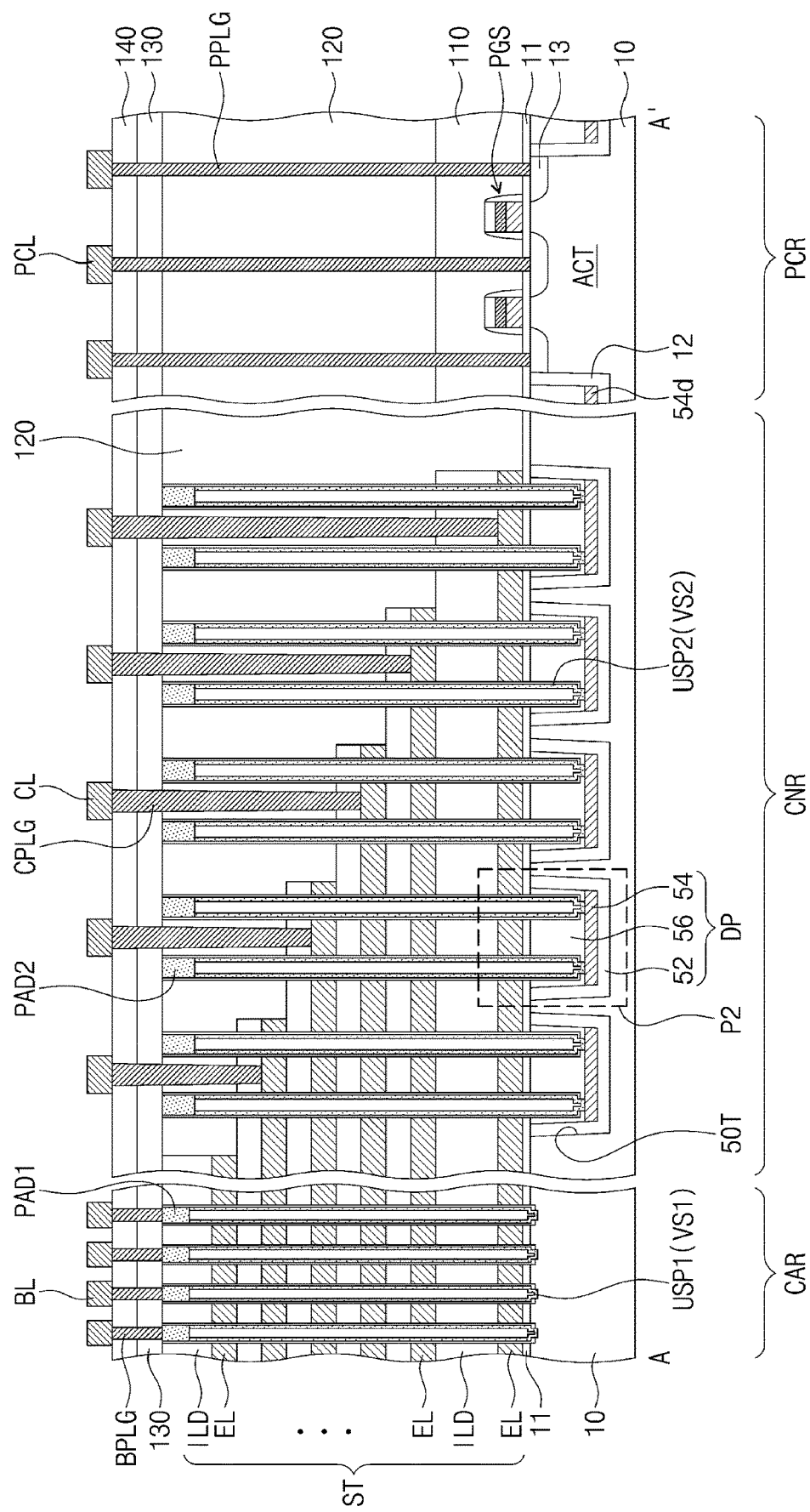
FIGS. 5 and 6 are sectional views taken along a line A-A' of FIG. 1A that illustrate a three-dimensional semiconductor memory device according to an embodiment of the inventive concept.
Figure 6:
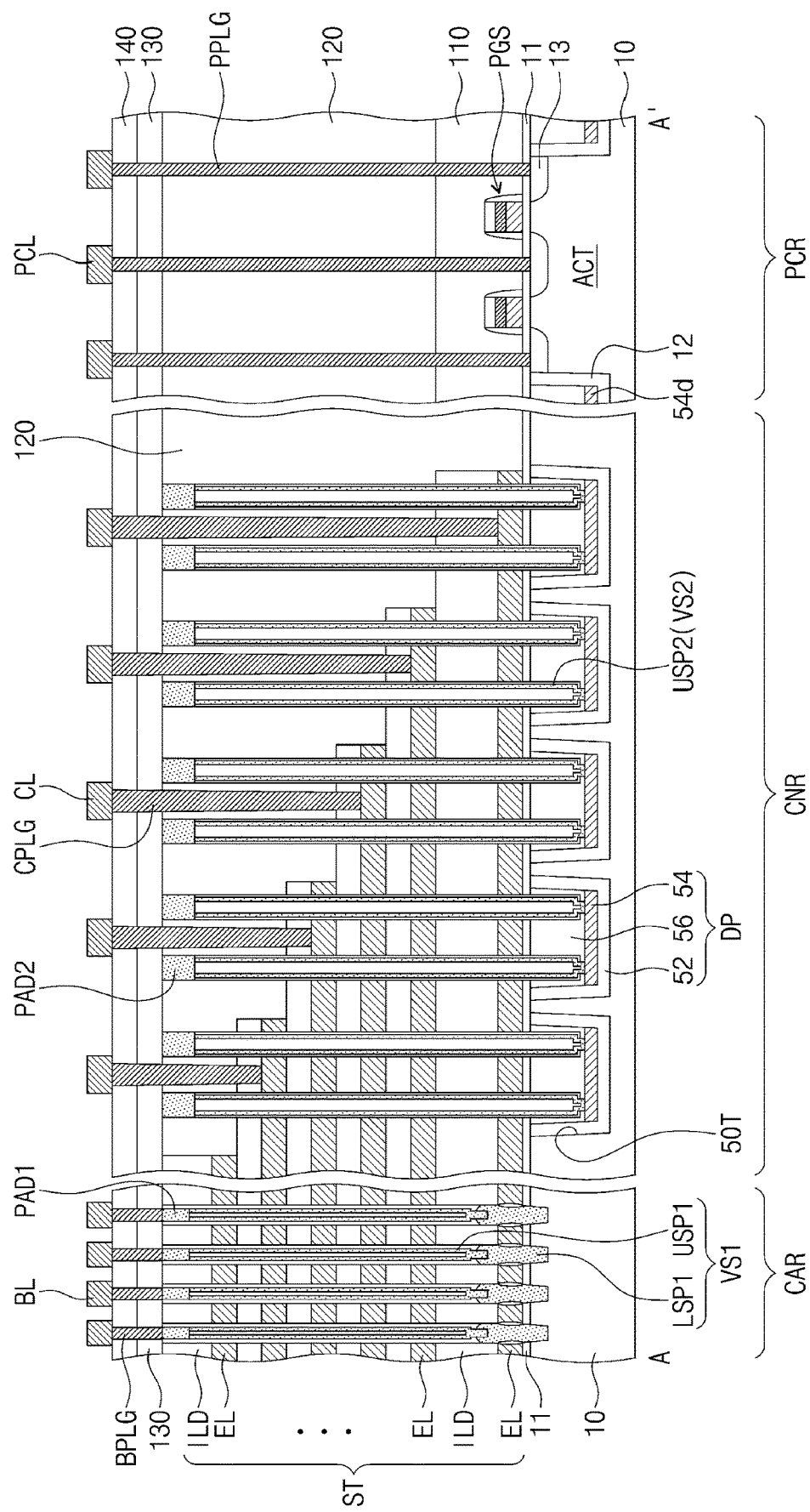
Figure 7:
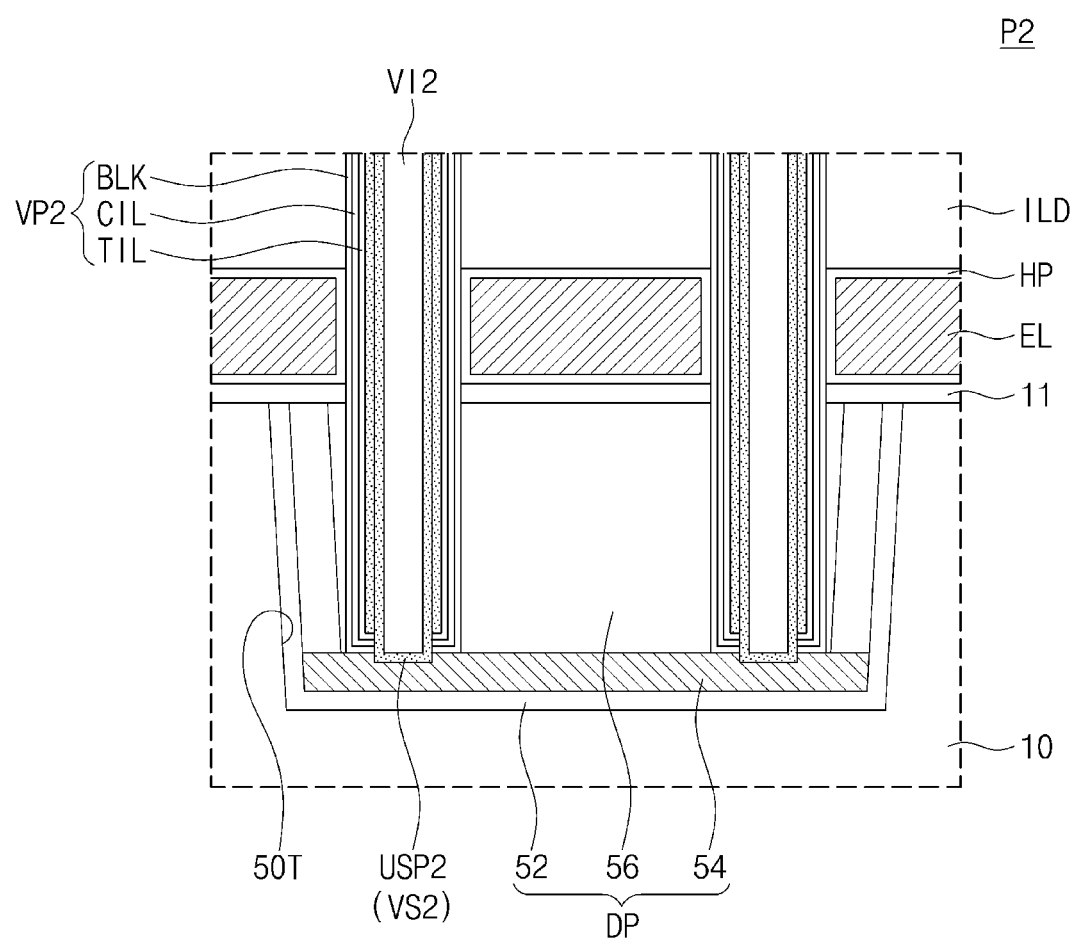
FIG. 7 is an enlarged sectional view of a portion 'P2' of FIG. 5.

FIGS. 5 and 6 are sectional views taken along a line A-A' of FIG. 1A that illustrate a three-dimensional semiconductor as error device according to an embodiment of the inventive concept. FIG. 7 is an enlarged sectional view of a portion 'P2' of FIG. 5.

Referring to FIGS. 5 and 6, according to an embodiment, the second lower semiconductor pattern LSP2 in the afore-described dummy channel structures VS2 have been omitted. In this case, the second upper semiconductor pattern USP2 makes contact with the etch stop pattern 54 on the connection region CNR. The second upper semiconductor pattern USP2 has a bottom surface positioned below the top surface of the etch stop pattern 54, as shown in FIG. 7. The second vertical insulating pattern VP2 enclose a sidewall of the second upper semiconductor pattern USP2 on the etch stop pattern 54.

Referring to FIG. 5, according to an embodiment, the first lower semiconductor pattern LSP1 in the afore-described cell channel structures VS1 has been omitted, and in this case, the first upper semiconductor pattern USP1 makes direct contact with the cell array region CAR of the substrate 10.

Figure 8A:
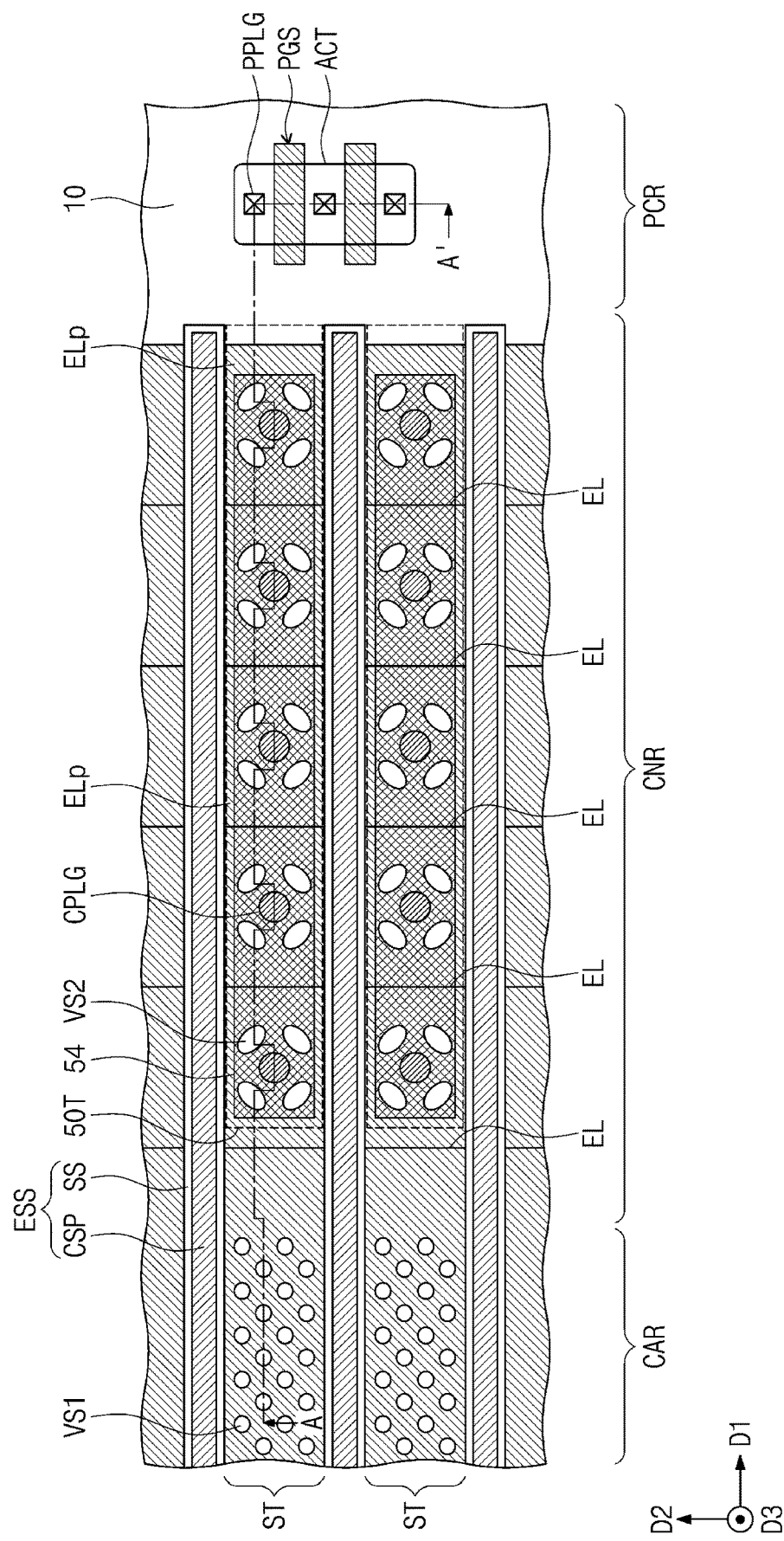
FIGS. 8A and 8B are plan views of a three-dimensional semiconductor memory device according to an embodiment of the inventive concept.
Figure 8B:
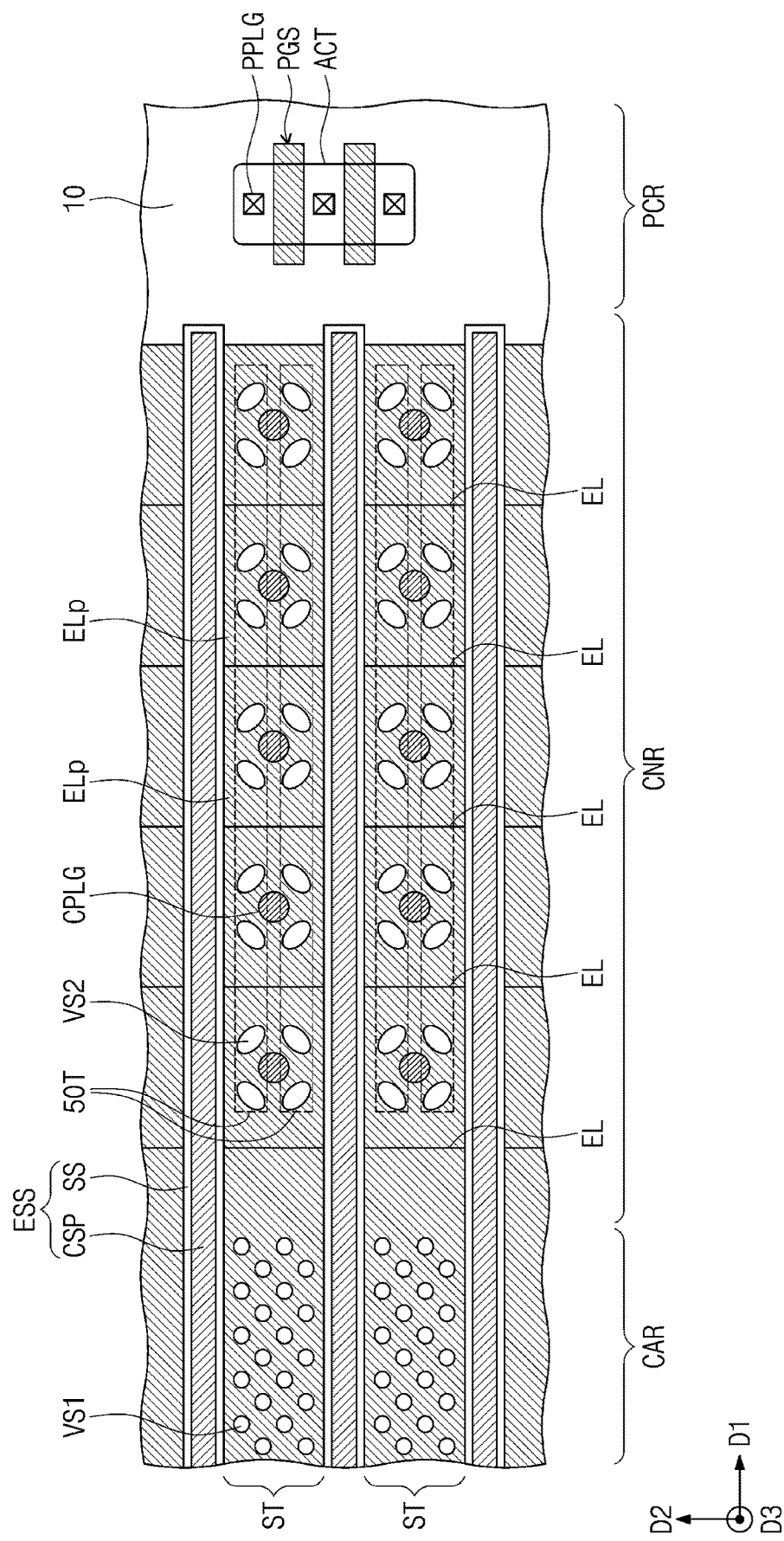
Figure 9:
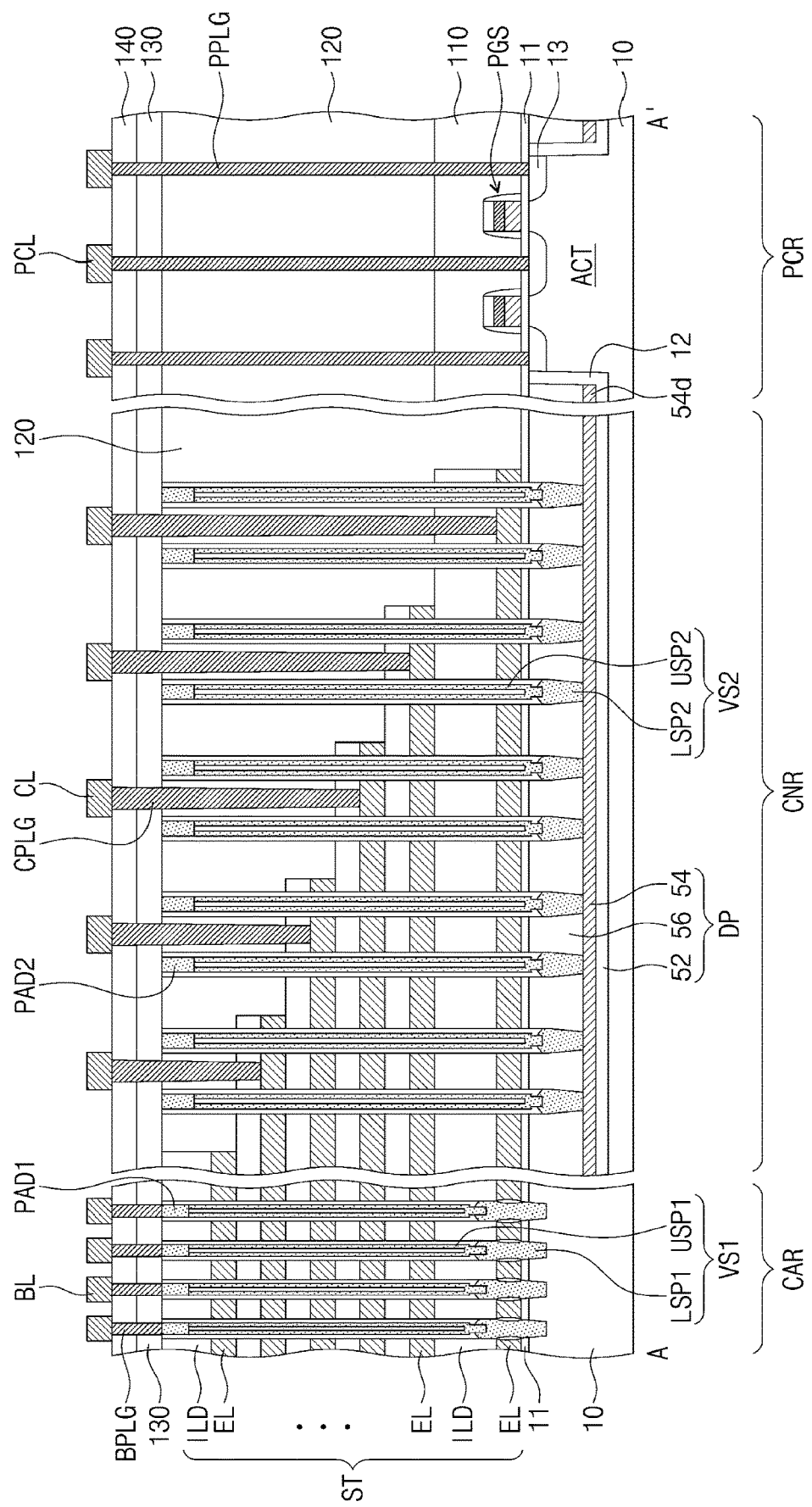
FIG. 9 is a sectional view of a three-dimensional semiconductor memory device according to an embodiment of the inventive concept, taken along a line A-A' of FIG. 8A.

FIGS. 8A and 8B are plan views of a three-dimensional semiconductor memory device according to an embodiment of the inventive concept. FIG. 9 is a sectional view of a three-dimensional semiconductor memory device according to an embodiment of the inventive concept, taken along a line A-A' of FIG. 8A.

Referring to FIGS. 8A, 8B, and 9, according to an embodiment, the substrate 10 includes dummy trenches 50T disposed on the connection region CNR and that extend in the first direction, and the dummy insulating structures DP are disposed in the dummy trenches 50T, respectively. In other words, the dummy insulating structures DP have a line shape structure disposed below the electrode structure ST of the connection region CNR and extend in the first direction. In other words, the etch stop patterns 54 have a line shape disposed on the connection region CNR and extend in the first direction. A plurality of the dummy channel structures VS2 are disposed on a single etch stop pattern 54.

Referring to FIG. 8A, according to an embodiment, the dummy insulating structures DP are disposed below the electrode structures ST, respectively, and on the connection region CNR. In other words, each of the dummy insulating structures DP overlaps the staircase structure of the electrode structure ST, when viewed in a plan view.

In certain embodiments, as shown in FIG. 8B, a pair of the dummy insulating structures DP that extend in the first direction D1 are disposed below each of the electrode structure ST.

Figure 10A:
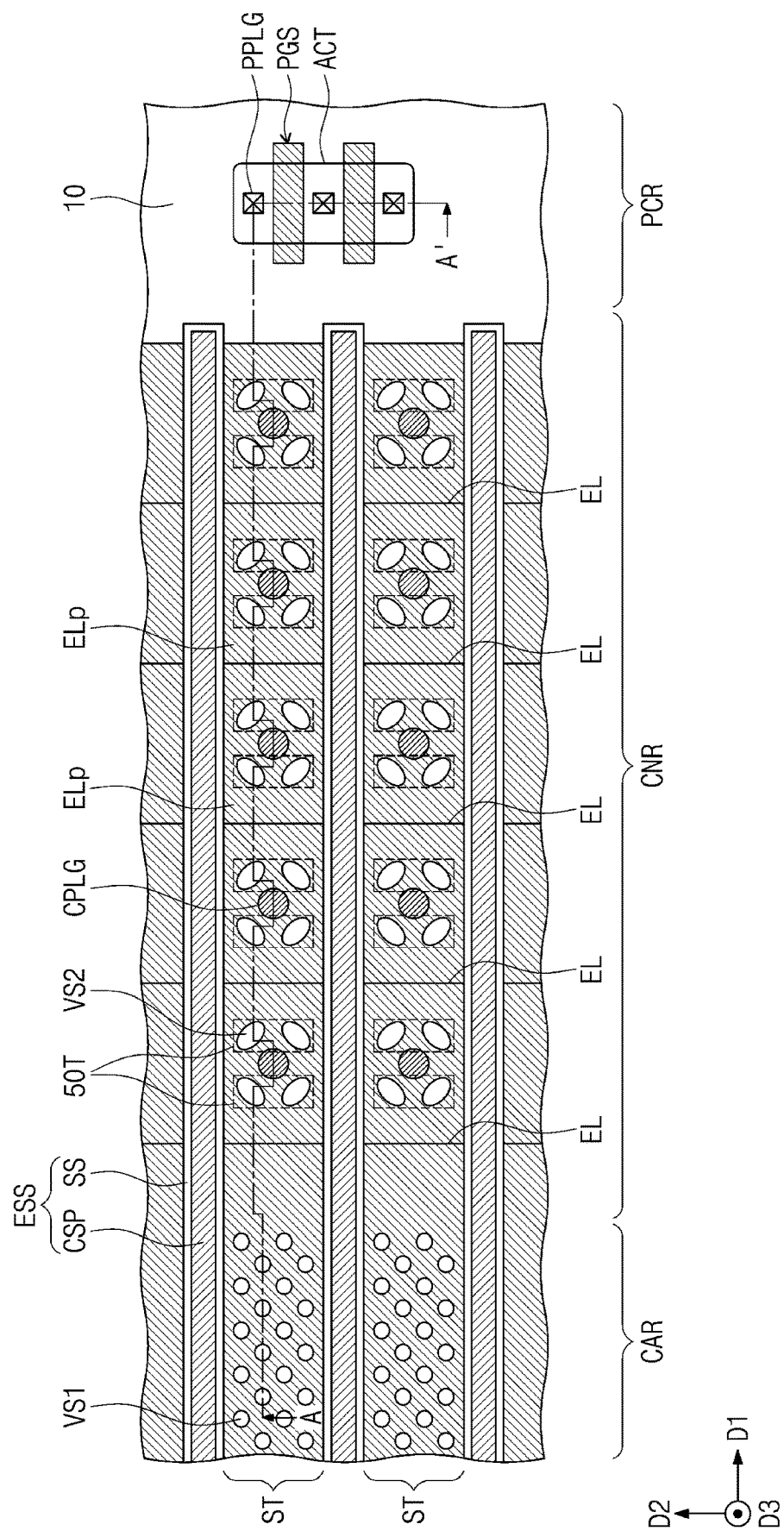
FIGS. 10A and 10B are plan views of a three-dimensional semiconductor memory device according to an embodiment of the inventive concept.
Figure 10B:
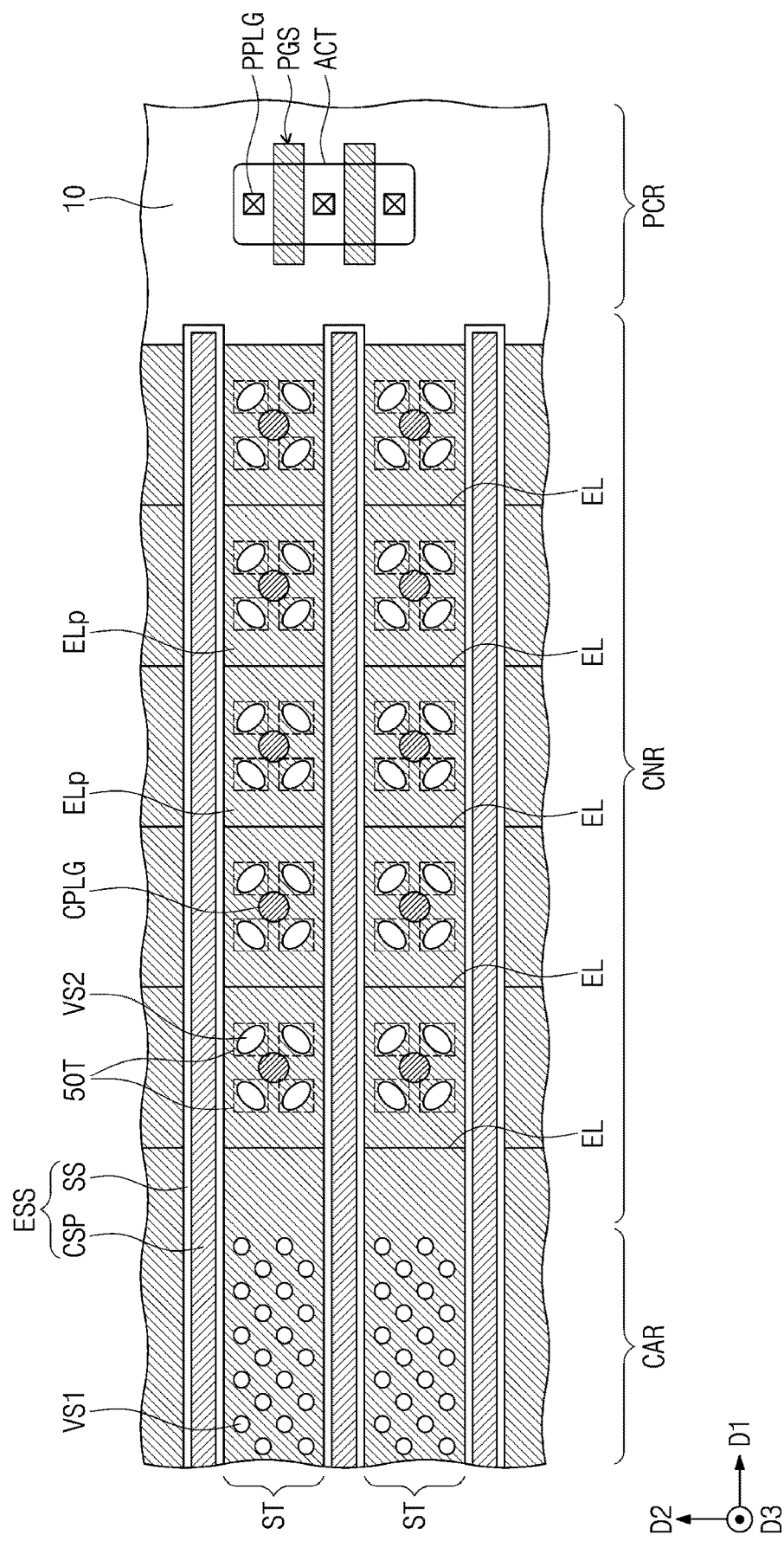
Figure 11:
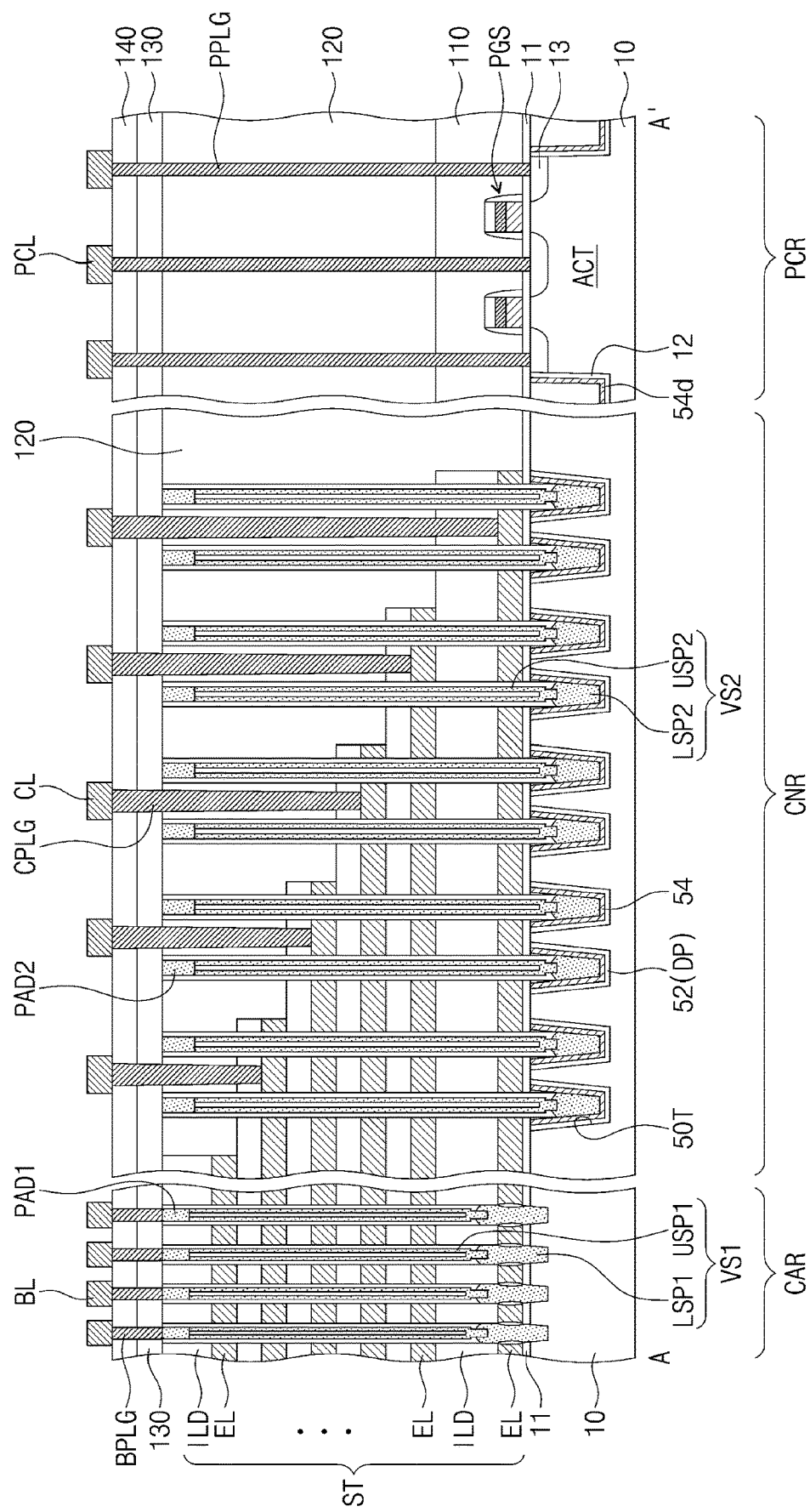
FIG. 11 is a sectional view of a three-dimensional semiconductor memory device according to an embodiment of the inventive concept, taken along a line A-A' of FIG. 10A.

FIGS. 10A and 10B are plan views of a three-dimensional semiconductor memory device according to an embodiment of the inventive concept. FIG. 11 is a sectional view of a three-dimensional semiconductor memory device according to an embodiment of the inventive concept, taken along a line A-A' of FIG. 10A.

Referring to FIGS. 10A and 10B, according to an embodiment, a plurality of the dummy insulating structures DP are disposed below the pad portion ELp of each electrode EL. The dummy insulating structures DP are spaced apart from each other in the first and second directions D1 and D2 on the connection region CNR.

According to an embodiment, a width in the first or second direction D1 or D2 of the dummy insulating structures DP is less than a width in the second direction D2, of the electrode structure ST. The width in the first or second direction D1 or D2 of the dummy insulating structures DP is less than the width of the pad portion ELp of each electrode EL.

Referring to FIGS. 10A and 11, according to an embodiment, a pair of the dummy channel structures VS2 adjacent to each other in the second direction D2 penetrate a portion of each of the dummy insulating structures DP and make contact with the etch stop pattern 55.

As another example, referring to FIG. 10B, according to an embodiment, the dummy channel structures VS2 penetrate portions of the dummy insulating structures DP, respectively. In other words, the dummy channel structures VS2 are disposed on the etch stop patterns 54, respectively.

Figure 12:
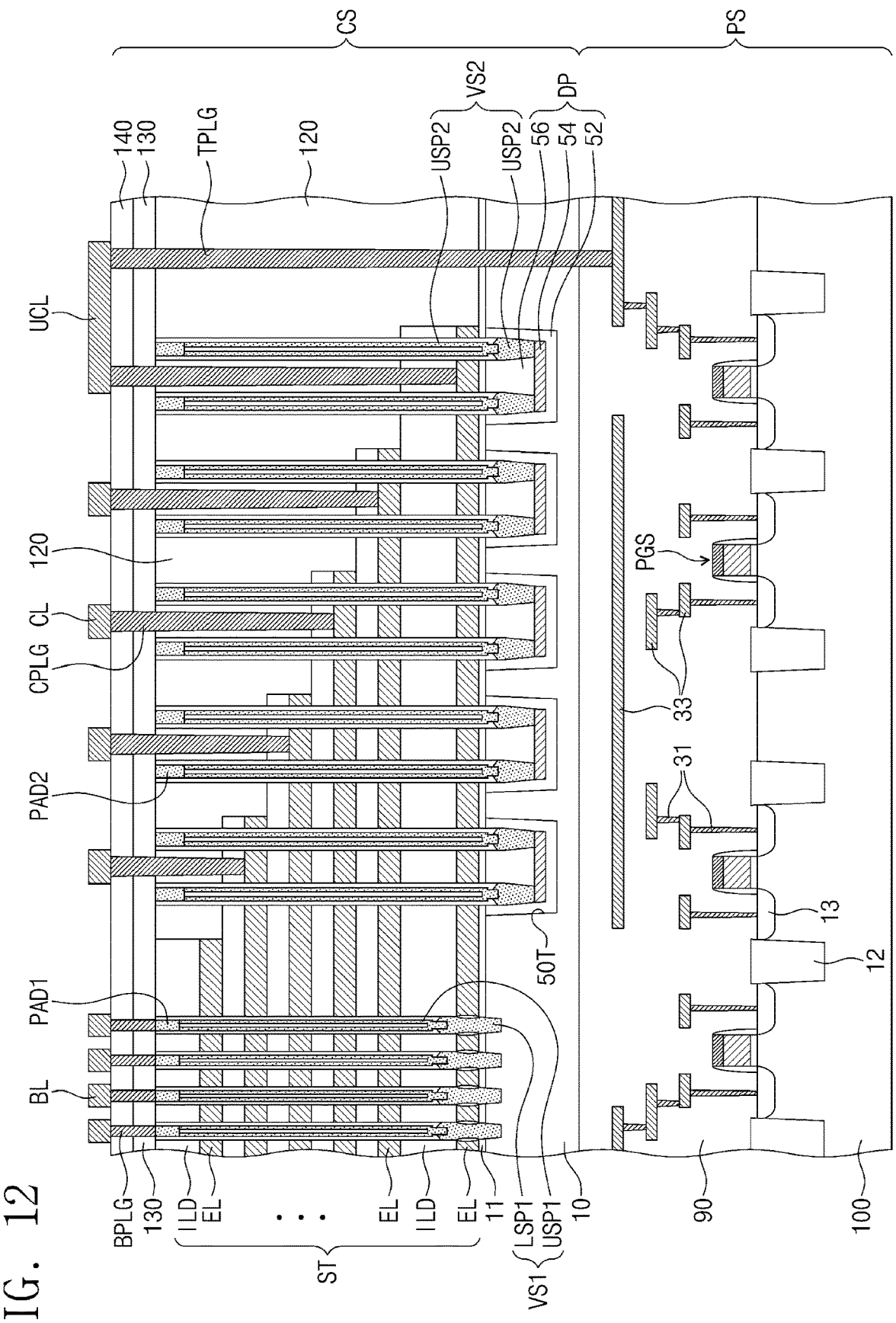
FIG. 12 is a sectional view of a three-dimensional semiconductor memory device according to an embodiment of the inventive concept.

FIG. 12 is a sectional view of a three-dimensional semiconductor memory device according to an embodiment of the inventive concept.

Referring to FIG. 12, according to an embodiment, a three-dimensional semiconductor memory device according to an embodiment of the inventive concept includes a peripheral logic structure PS and a cell array structure CS, and the cell array structure CS is stacked on the peripheral logic structure PS. In other words, the peripheral logic structure PS and the cell array structure CS overlap each other, when viewed in a plan view.

According to an embodiment, the peripheral logic structure PS and the cell array structure CS are sequentially stacked on the substrate 100. In other words, the peripheral logic structure PS is disposed between the substrate 100 and the cell array structure CS, when viewed in a vertical section. That is, the peripheral logic structure PS and the cell array structure CS overlap each other, when viewed in a plan view.

According to an embodiment, the substrate 100 may be, for example, a bulk silicon wafer, a silicon-on-insulator (SOI) wafer, a germanium wafer, a germanium-on-insulator (GOI) wafer, a silicon-germanium wafer, or a substrate that includes an epitaxial layer formed by a selective epitaxial growth (SEG) process.

According to an embodiment, the substrate, 100 includes an n-well region doped with n-type impurities and, a p-well region doped with p-type impurities. Peripheral active regions are delimited by device isolation patterns 12.

According to an embodiment, the peripheral logic structure PS includes high- and low-voltage transistors, resistors, and capacitors. In detail, the peripheral logic structure PS include the peripheral gate stacks PGS, source and drain impurity regions on either side of the peripheral gate stacks PGS, peripheral circuit plugs 31, peripheral circuit lines 33, and a lower insulating gapfill layer 90 that covers peripheral circuits. In more detail, PMOS transistors are formed on the n-well region, and NMOS transistors are formed on the p-well region. Peripheral circuit lines ICL is electrically connected to the peripheral circuits through the peripheral circuit plugs 31. For example, the peripheral circuit plugs 31 and the peripheral circuit lines ICL are coupled to the NMOS and PMOS transistors.

According to an embodiment, the lower insulating gapfill layer 90 covers the peripheral circuits, the peripheral circuit plugs 31, and the peripheral circuit lines 33. The lower insulating gapfill layer 90 includes a plurality of stacked insulating layers.

According to an embodiment, the cell array structure CS is disposed on the lower insulating gapfill layer 90 and includes the substrate 10, the electrode structures ST, the cell and dummy channel structures VS1 and VS2, the dummy insulating structures DP, described above. In other words, the substrate 10 described above is disposed between the electrode structures ST and the peripheral logic structure PS.

In addition, according to an embodiment, the cell array structure CS are electrically connected to the peripheral logic structure PS via penetration plugs TPLG. For example, the penetration plugs TPLG electrically connect upper interconnection lines UCL of the cell array structure CS to the peripheral circuit lines 33 of the peripheral logic structure PS.

Figure 13:
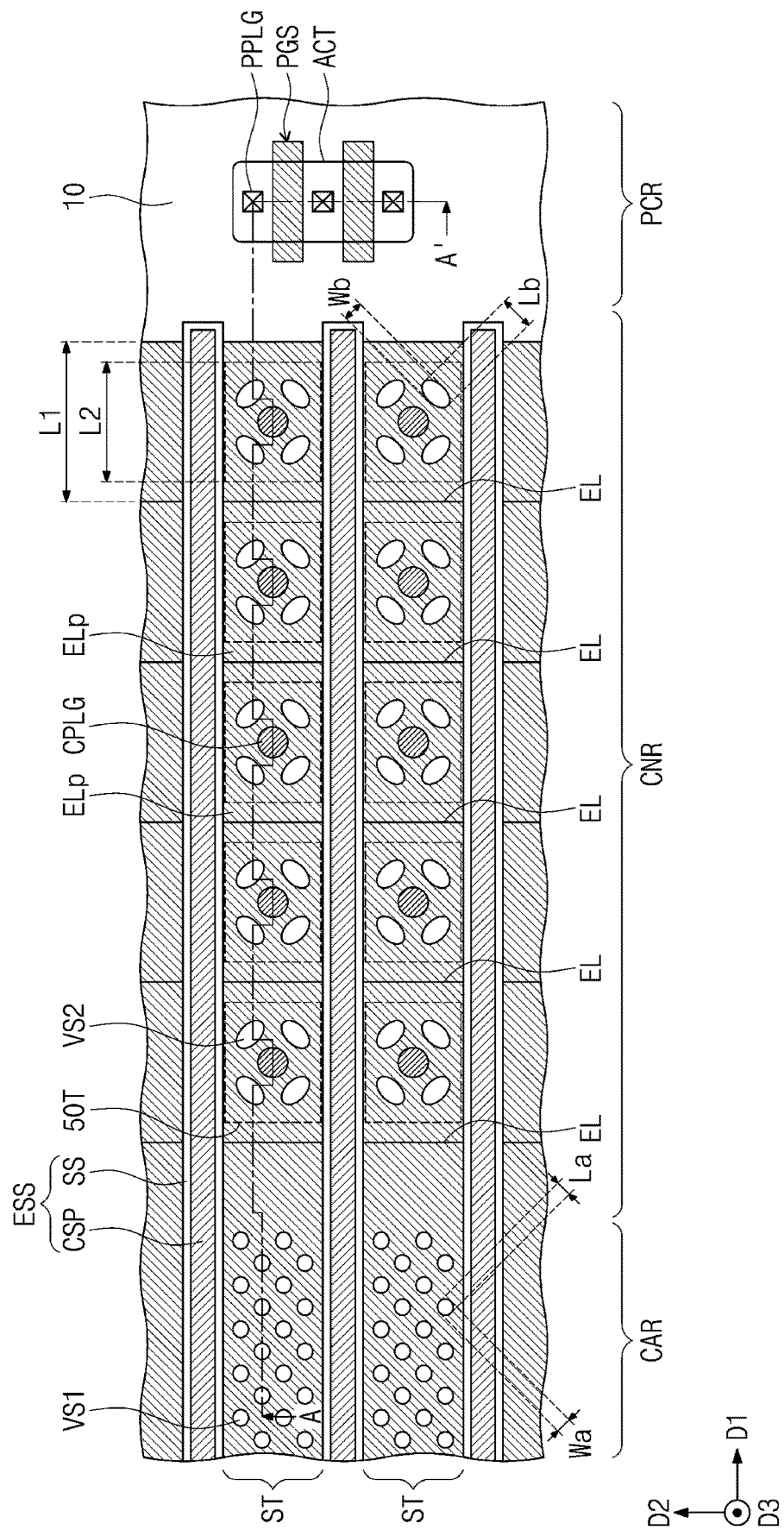
FIG. 13 is a plan view of a three-dimensional semiconductor memory device according to an embodiment of the inventive concept.
Figure 14:
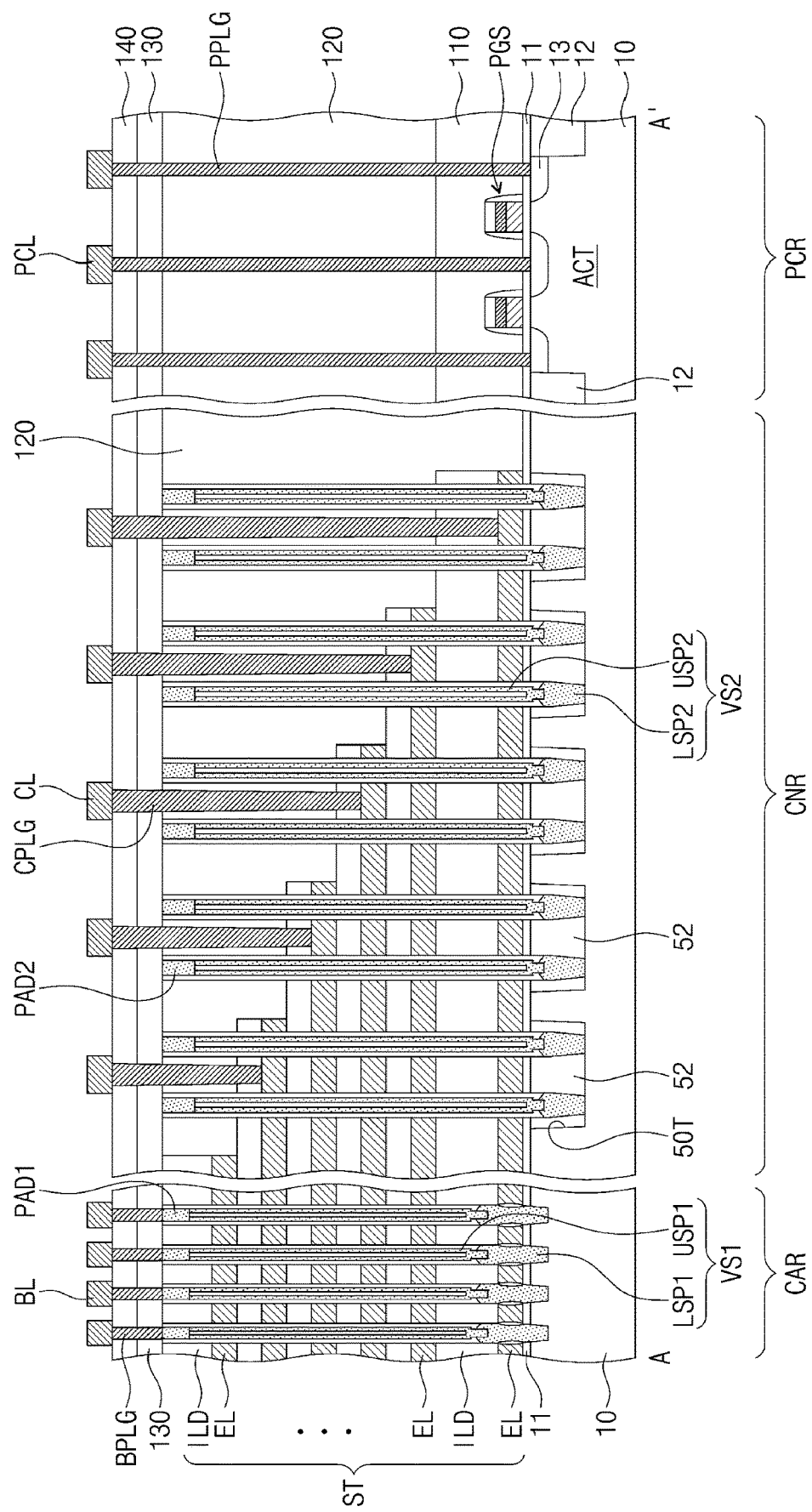
FIG. 14 is a sectional view of a three-dimensional semiconductor memory device according to an embodiment of the inventive concept, taken along a line A-A' of FIG. 13.

FIG. 13 is a plan view of a three-dimensional semiconductor memory device according to an embodiment of the inventive concept. FIG. 14 is a sectional view of a three-dimensional semiconductor memory device according to an embodiment of the inventive concept, taken along a line A-A' of FIG. 13.

Referring to FIGS. 13 and 14, according to an embodiment, the etch stop patterns 54 of an afore-described three-dimensional semiconductor memory device is omitted.

In detail, according to an embodiment, the substrate 10 includes dummy trenches 50T in the connection region CNR, and the dummy insulating patterns 52 are disposed to till the dummy trenches 50T, respectively. The dummy insulating patterns 52 have bottom surfaces positioned below the bottom surfaces of the cell channel structures VS1.

Similar to an above embodiment, the electrode structures ST are disposed on the substrate 10 parallel to the first direction D1 and cover the dummy insulating patterns 52 on the connection region CNR.

According to an embodiment, on the cell array region CAR, the cell channel structures VS1 penetrate the electrode structure ST. Each of the cell channel structures VS1 has a circular top surface. Each of the cell channel structures VS1 has a first width Wa that corresponds to the minimum width of a minor axis and have a first length La corresponding to the maximum length in a major axis perpendicular to the minor axis. Here, the first width Wa may be substantially equal to the first length La, or the first length La may be greater than the first width Wa. If the first length La is greater than the first width Wa, then each of the cell channel structures VS1 has an elliptical top surface.

According to an embodiment, the dummy channel structures VS2 penetrate the electrode structure ST and the dummy insulating pattern 52 and make contact with the substrate 10. The second lower semiconductor pattern LSP2 of the dummy channel structure VS2 makes direct contact with the substrate 10 in the dummy insulating pattern 52. A bottom surface of the second lower semiconductor pattern LSP2 makes direct contact with the substrate 10, and a sidewall of the second lower semiconductor pattern LSP2 makes direct contact, with the dummy insulating pattern 52. A top surface of the second lower semiconductor pattern LSP2 is positioned below the bottom surface of the lowermost electrode EL of the electrode structure ST. A bottom surface of the second upper semiconductor pattern USP2 is positioned below the bottom surface of the lowermost electrode EL and is positioned below the top surface of the second lower semiconductor pattern LSP2.

According to an embodiment, each of the dummy channel structures VS2 has an elliptical top surface, as described above. In other words, the top surface of the dummy channel structure VS2 has a second width Wb that corresponds to the minimum width of a minor and a second length Lb that corresponds to the maximum length of a major axis, which is greater than the second width Wb of the minor axis. Here, the second width Wb of the dummy channel structures VS2 is greater than the first length La of the cell channel structure.

FIGS. 15A to 20A are plan views that illustrate a method of fabricating a three-dimensional semiconductor memory device, according to an embodiment of the inventive concept. FIGS. 15B to 15D are sectional views taken along a line A-A' of FIG. 15A. FIGS. 16B to 16D are sectional views taken along a line A-A' of FIG. 16A. FIGS. 17B to 20B are sectional views taken along lines A-A' of FIGS. 17A to 20A, respectively.

Figure 15A:
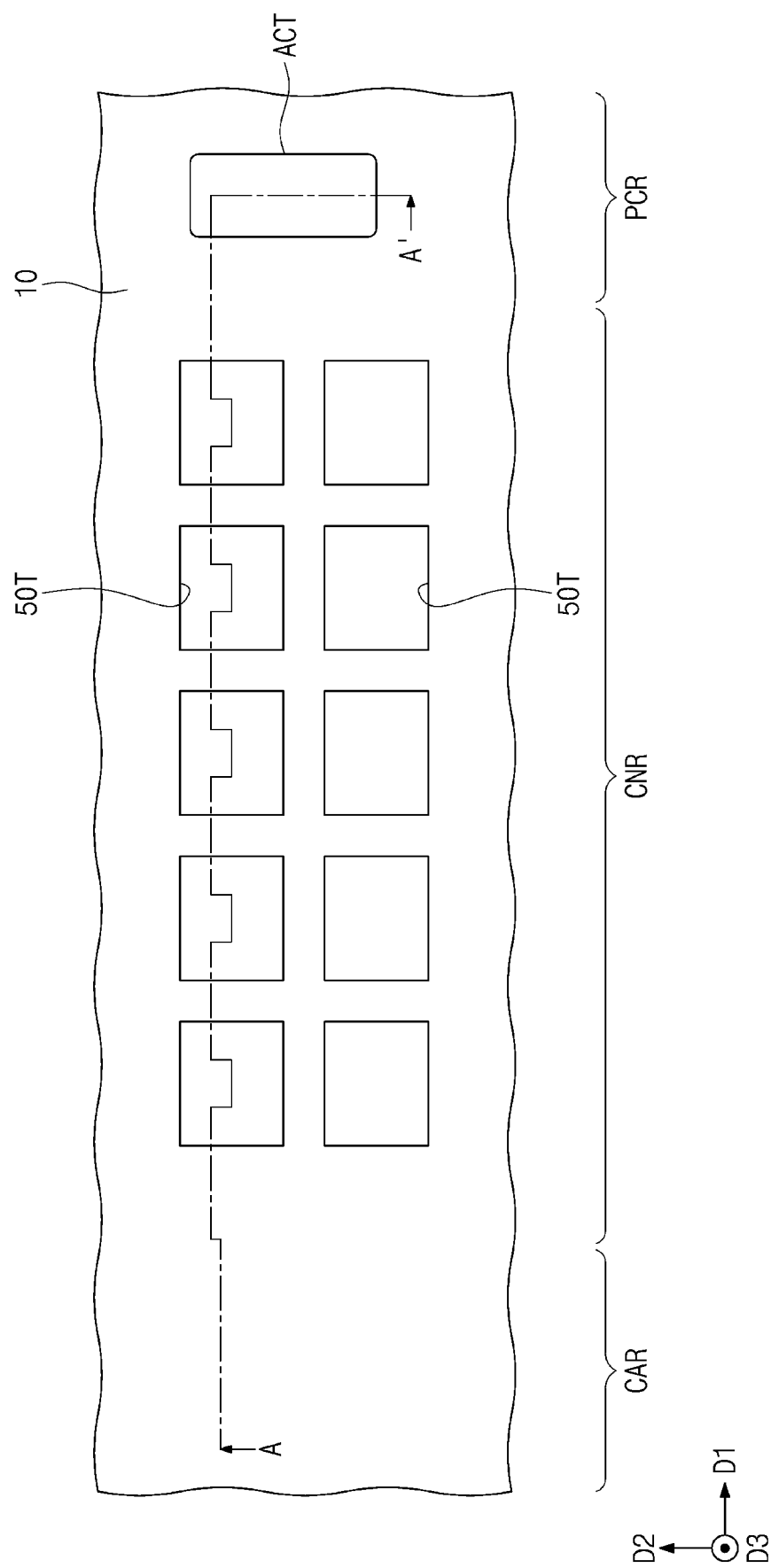
Figure 15B:
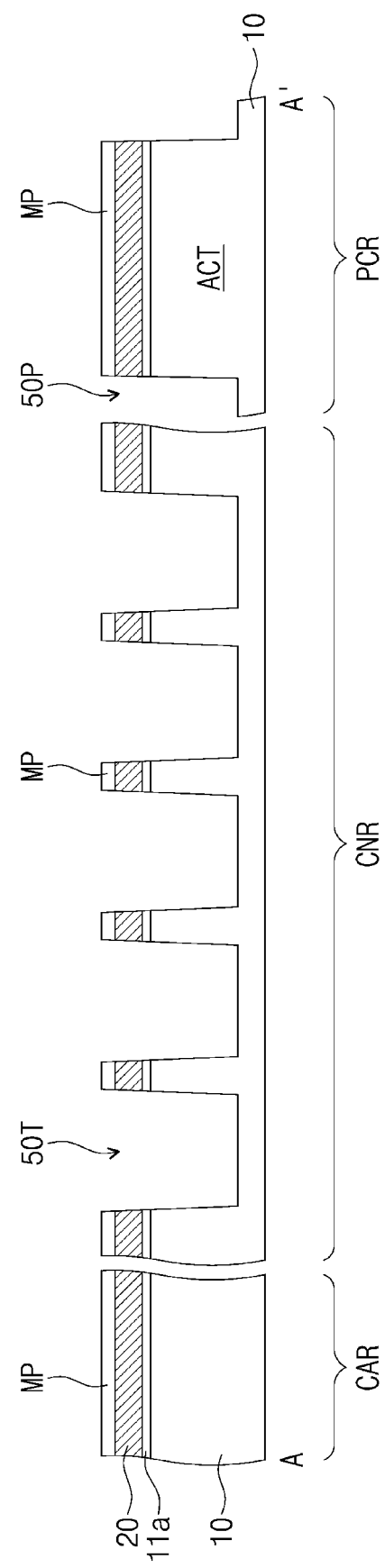
FIGS. 15B to 15D are sectional view taken along a line A-A' of FIG. 15A.

Referring to FIGS. 15A and 15B, according to an embodiment, the substrate 10 includes the cell array region CAR, the connection region CNR, and the peripheral circuit region PCR. The substrate 10 is patterned to form the dummy trenches 50T on the connection region CNR and a peripheral trench 50P on the peripheral circuit region PCR.

In detail, according to an embodiment, a buffer oxide layer 11a and a gate conductive layer 20 are sequentially formed on the substrate 10, and mask patterns MP are formed on the gate conductive layer 20.

According to an embodiment, the buffer oxide layer 11a may be a thermal oxidation layer or a silicon oxide layer. The gate conductive layer 20 includes at least one of, for example, doped poly silicon, metals, such as, tungsten, copper, aluminum, etc., conductive metal nitrides, such as titanium nitride, tantalum nitride, etc., transition metals, such as titanium, tantalum, etc., or metal silicides, such as cobalt silicide, tungsten silicide, etc. The mask patterns MP include at least one of silicon oxide, silicon nitride, or silicon oxynitride.

According to an embodiment, the buffer oxide layer 11a and the substrate 10 are anisotropically etched using the mask pattern MP as an etch mask to form the dummy trenches 50T and the peripheral trench 50P.

According to an embodiment, the peripheral trench 50P delimits the peripheral active region ACT. The dummy trenches 50T may have a line shape, a bar shape, or an island shape, as previously described with reference to FIGS. 1A, 1B, 8A, 8B, 10A, and 10B.

Figure 15C:
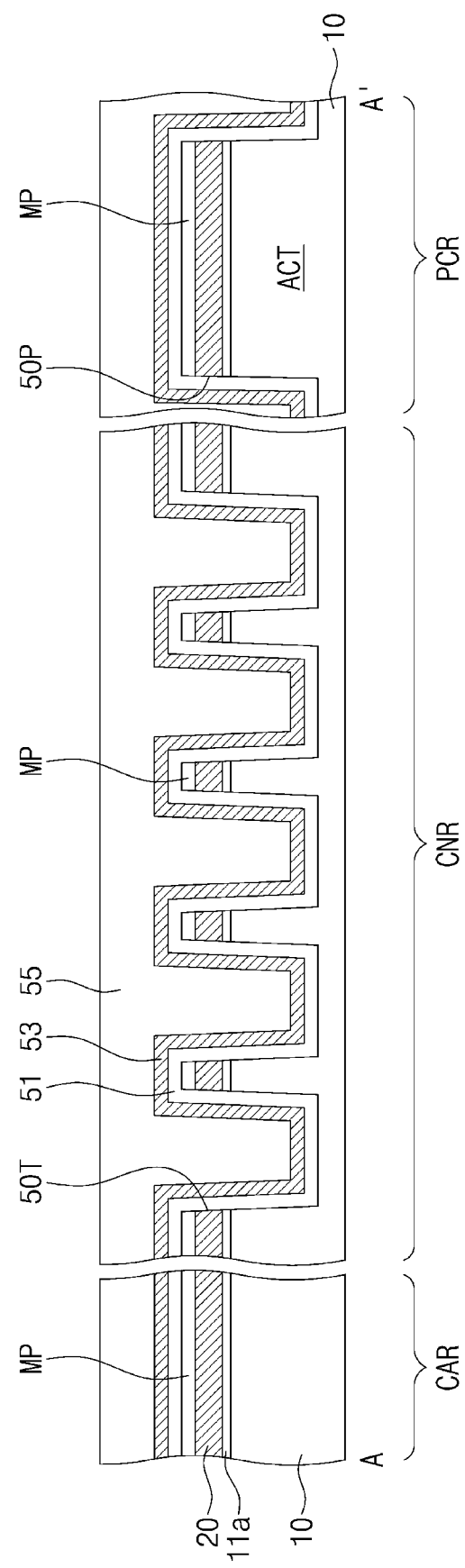

Referring to FIGS. 15A and 15C, according to an embodiment, a dummy insulating layer 51, an etch stop layer 53, and a first insulating gapfill layer 55 are sequentially formed on the dummy trenches 50T and the peripheral trench 50P.

According to an embodiment, the dummy insulating layer 51 is deposited and covers the entire top surface of the substrate 10 in which the dummy trenches 50T and the peripheral trench 50P are formed to a substantially uniform thickness. In other words, the dummy insulating layer 51 directly covers inner surfaces of the dummy trenches 50T and an inner surface of the peripheral trench 50P.

According to an embodiment, the etch stop layer 53 is, deposited to a substantially uniform thickness on the dummy insulating layer 51. The etch stop layer 53 includes a material having an etch selectivity with respect to the dummy insulating layer 51 and the first insulating gapfill layer 55. The etch stop layer 53 includes at least one of, for example, a poly-silicon layer, a silicon carbon layer, a silicon germanium layer, a metal layer, a metal nitride layer, or a metal silicide layer.

According to an embodiment, the first insulating gapfill layer 55 is formed on the etch stop layer 53 and substantially completely fills the dummy trenches 50T and the peripheral trench 50P covered by the dummy insulating layer 51 and the etch stop layer 53. The first insulating gapfill layer 55 is formed of an insulating material having an etch selectivity with respect to the etch stop layer 53. The first insulating gapfill layer 55 is formed of or includes at least one of plasma-enhanced tetraethylorthosilicate (PE-TEOS), $O_3$-TEOS, undoped silicate glass (USG), phosphosilicate glass (PSG), borosilicate Glass (BSG), borophosphosilicate glass (BPSG), fluoride silicate glass (FSG), spin on glass (SOG), or tonen silazene (TOSZ), or any combination thereof.

Figure 15D:
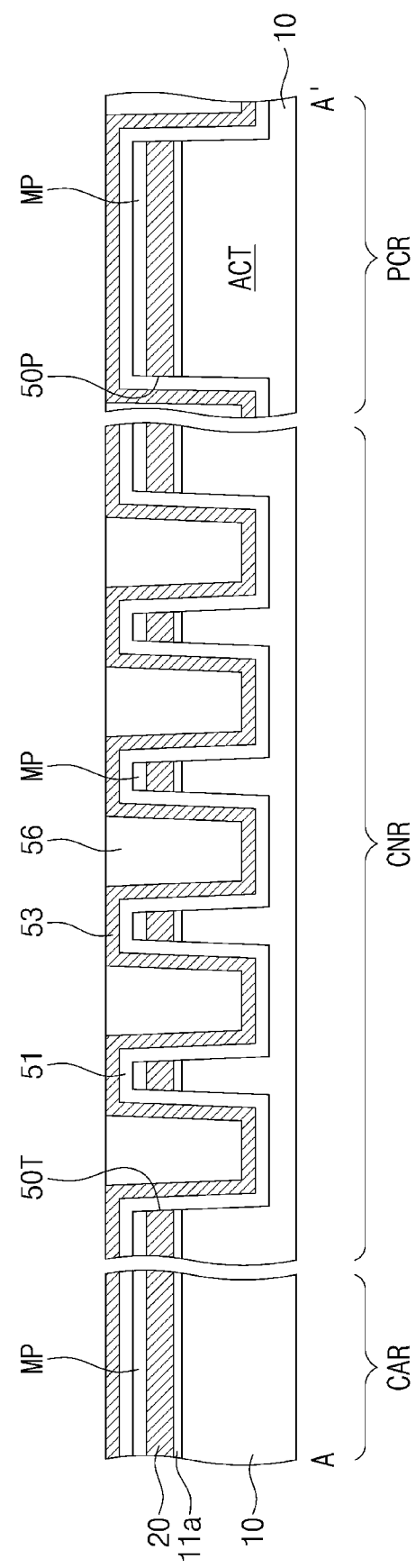

Next, according to an embodiment, referring to FIGS. 15A and 15D, after forming the first insulating gapfill layer 55, a planarization process is performed on the first insulating gapfill layer 55 that exposes a top surface of the etch stop layer 53. For example, a chemical mechanical polishing (CMP) process is performed as the planarization process, and in this case, a portion of the etch stop layer 53 is used as a polishing end point. Thus, the first buried insulating patterns 56 are formed in the dummy trenches 50T and the peripheral trench 50P, respectively.

Figure 16A:
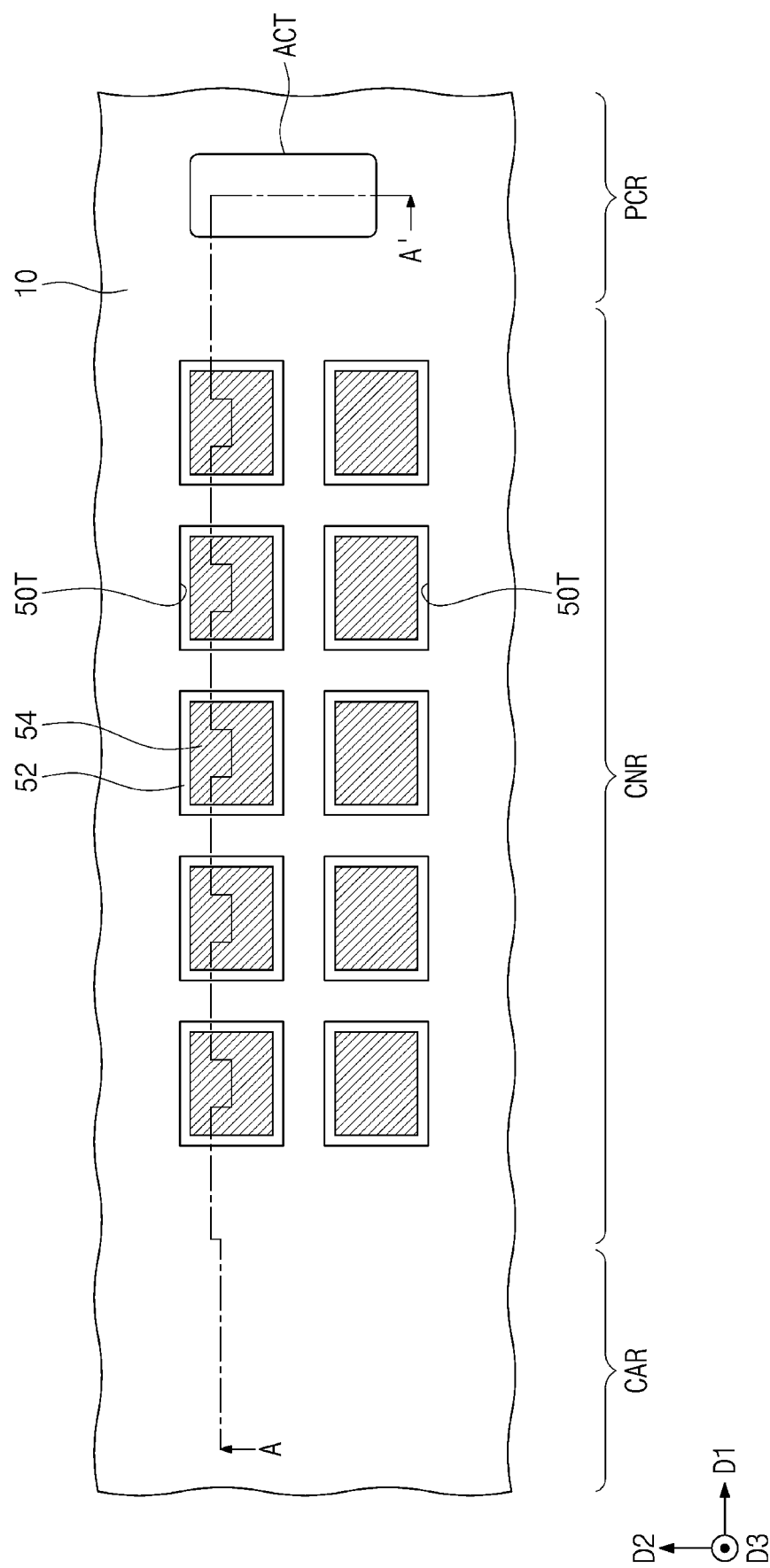
Figure 16B:
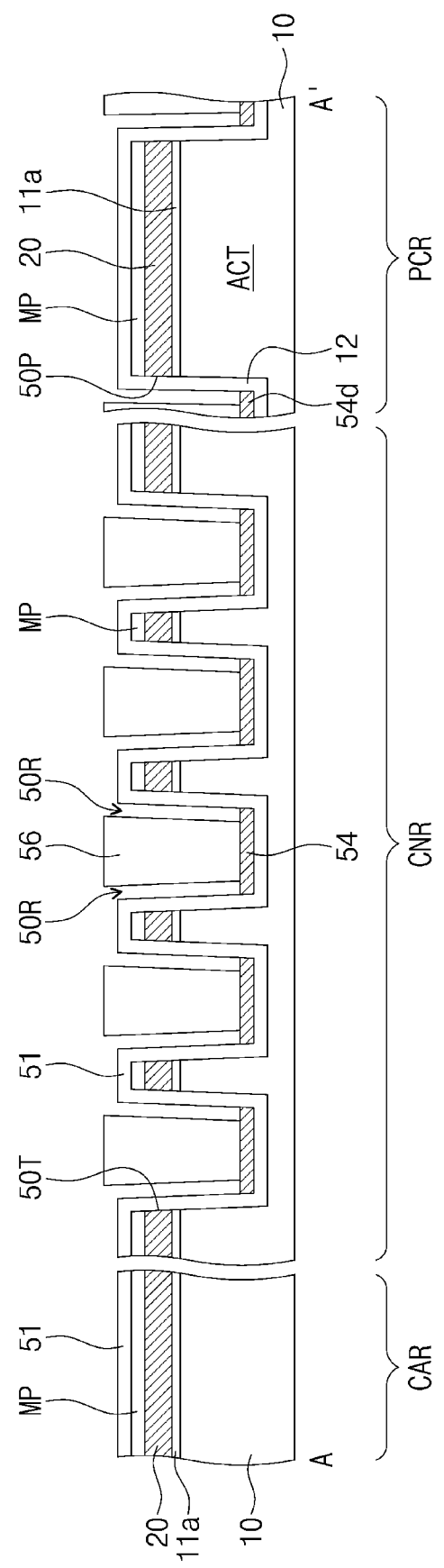
FIGS. 16B to 16D are sectional views taken along a line A-A' of FIG. 16A.

Referring to FIGS. 16A and 16B, according to an embodiment, the etch stop layer 53 exposed by the first buried insulating patterns 56 is anisotropically or isotropically etched to form the etch stop pattern 54 in each of the peripheral trenches 50P. In other words, the spaced apart etch stop patterns 54 are formed on the connection region CNR. When the etch stop patterns 54 are formed, the dummy pattern 54d, which is a portion of the etch stop layer 53, is formed in the peripheral trench 50P and on the peripheral circuit region PCR.

According to an embodiment, the anisotropic or isotropic etching, process is performed on the etch stop layer 53 using an etch recipe that has an etch selectivity with respect to the first buried insulating patterns 56 and the dummy insulating layer 51.

According to an embodiment, as a result of the anisotropic or isotropic etching of the etch stop layer 53, dummy recess regions 50R are formed between the first buried insulating patterns 56 and the dummy insulating layer 51. For example, the dummy recess regions 50R have bottom surfaces that are positioned below the top surface of the substrate 10.

In an embodiment, when the etch stop patterns 54 are formed in the dummy trenches 50T on the connection region CNR, a portion of the etch stop layer 53 remains in a portion of the peripheral trench 50P on the peripheral circuit region PCR.

Figure 16C:
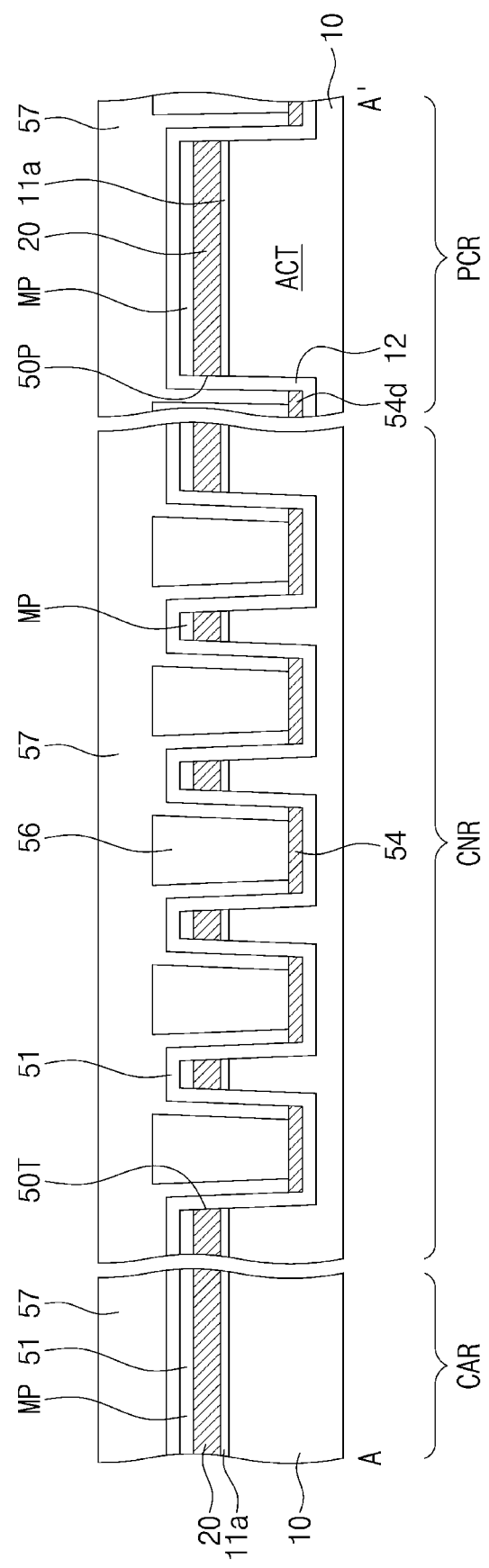

Referring to FIGS. 16A and 16C, according to an embodiment, a second insulating gapfill layer 57 is formed that fills the dummy recess regions 50R. The second insulating gapfill layer 57 is formed by a deposition process and covers portions of the dummy insulating layer 51 and the first buried insulating patterns 56.

According to an embodiment, the second insulating gapfill layer 57 is formed of an insulating material that has an etch selectivity with respect to the etch stop patterns 54. For example, the second insulating gapfill layer 57 include the same material as the dummy insulating layer 51 or the first buried insulating patterns 56.

Figure 16D:
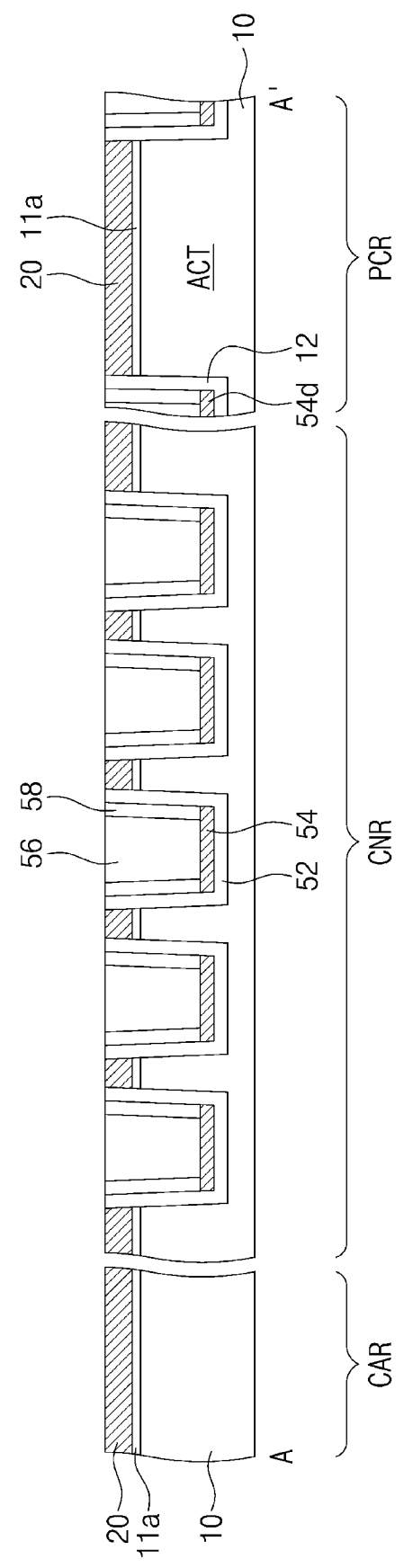

Referring to FIGS. 16A and 16D, according to an embodiment, after forming the second insulating gapfill layer 57, a planarization process is performed on the second insulating gapfill layer 57 that exposes a top surface of the gate conductive layer 20. Thus, second buried insulating patterns 58, each of which has a ring shape, are formed in the dummy trenches 50T, respectively. A planarization process is performed on the second insulating gapfill layer 57 that exposes the top surface of the buffer oxide layer 11a or the top surface of the substrate 10.

According to an embodiment, as a result of forming the first and second buried insulating patterns 56 and 58, the dummy insulating structures described above are formed. In other words, the first and second buried insulating patterns 56 and 58 are formed on the etch stop patterns 54. When the second buried insulating patterns 58 are formed of the same material as the first buried insulating patterns 56, there is no interface between the first and second buried insulating patterns 56 and 58.

According to an embodiment, during formation of the first and second buried insulating patterns 56 and 58, the device isolation pattern 12 are formed in the peripheral trench 50P.

An example in which the peripheral trench 50P and the dummy trenches 50T are formed at the same time has been described, but embodiments of the inventive concept are not limited thereto. For example, the device isolation pattern 12 may be formed first, and then the insulating pattern 52, the etch stop pattern 54, and the first buried insulating patterns 56 may be formed, or vice versa.

Figure 17A:
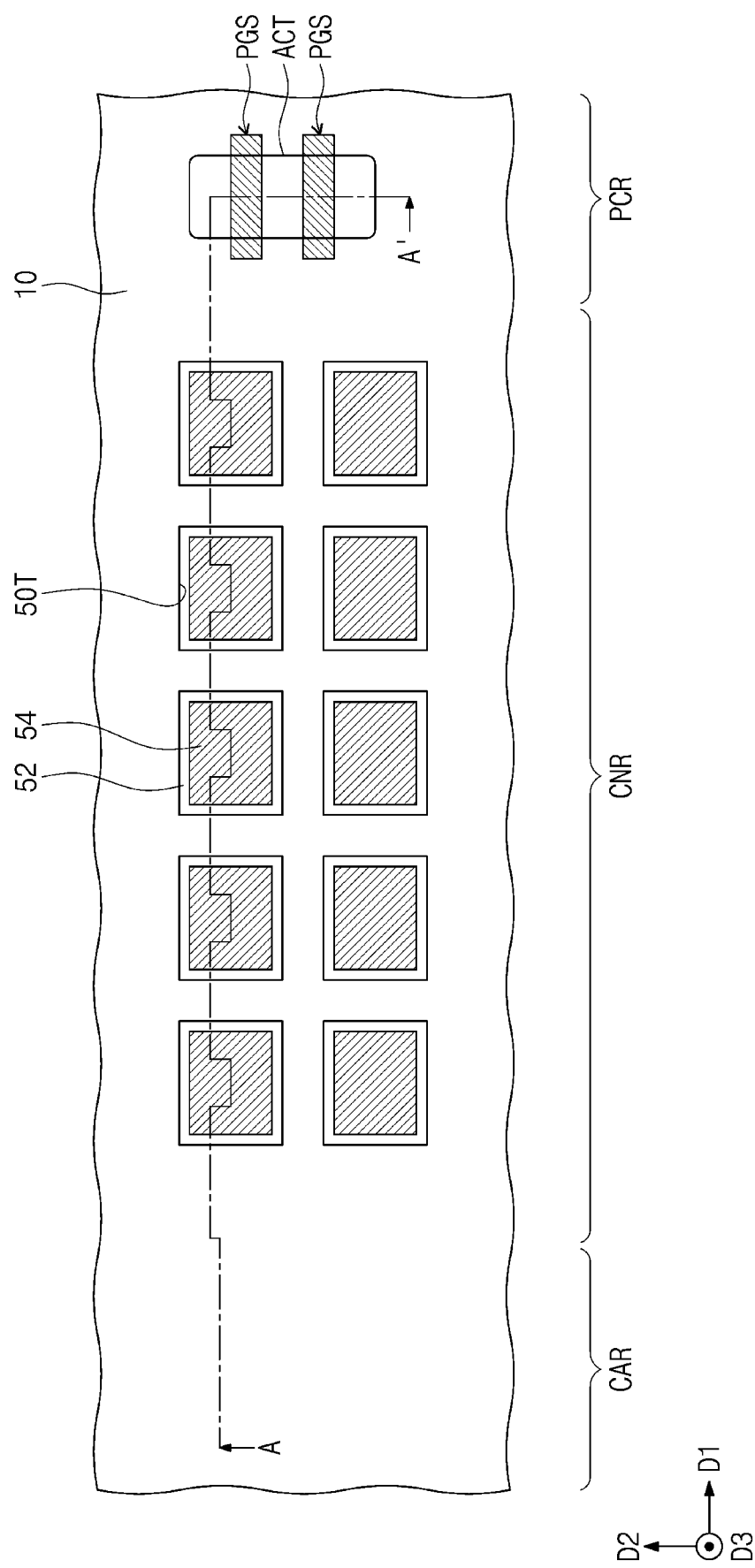
Figure 17B:
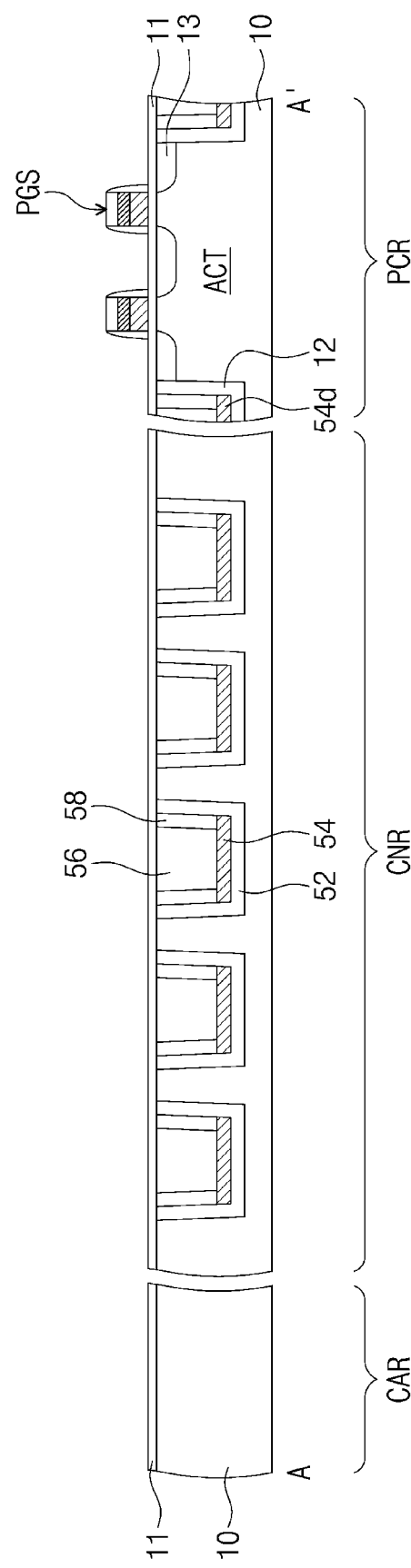

Referring to FIGS. 17A and 17B, according to an embodiment, after forming the first and second buried insulating patterns 56 and 58, the buffer insulating layer 11 is formed that covers the substrate 10, and the peripheral gate stacks PGS are formed on the buffer insulating layer 11 of the peripheral circuit region PCR.

According to an embodiment, the peripheral gate stack PGS is formed by sequentially forming a peripheral gate insulating layer, a doped poly-silicon layer, a gate metal layer, and a hard mask layer on the substrate 10 and then patterning them. Spacers are formed that cover opposite sidewalls of the peripheral gate stack PGS, and source and drain impurity regions 13 are formed in portions of the peripheral active region ACT at both sides of the peripheral gate stack PGS by doping first impurities, such as boron (B) or phosphorus P.

Figure 18A:
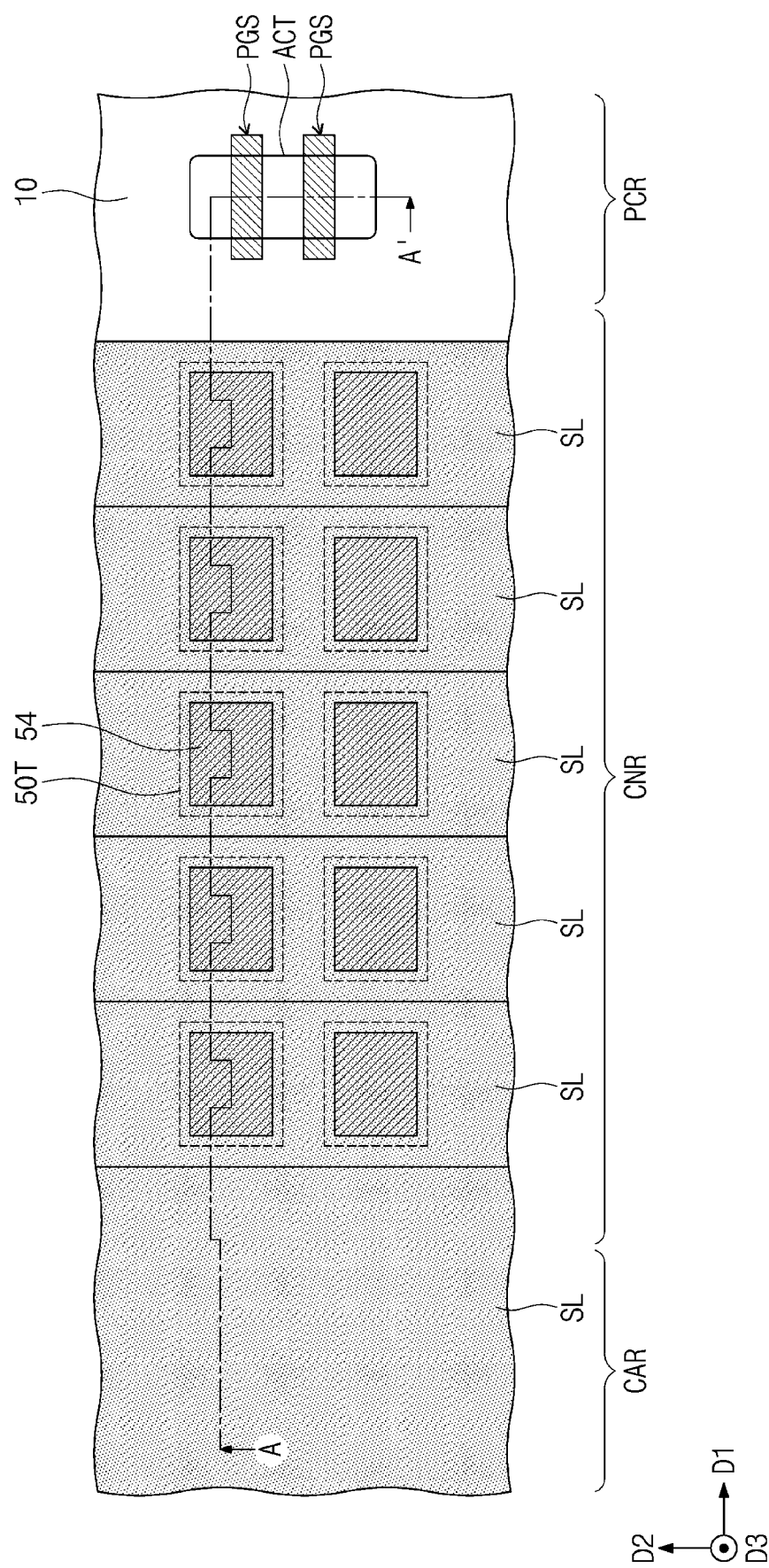
Figure 18B:
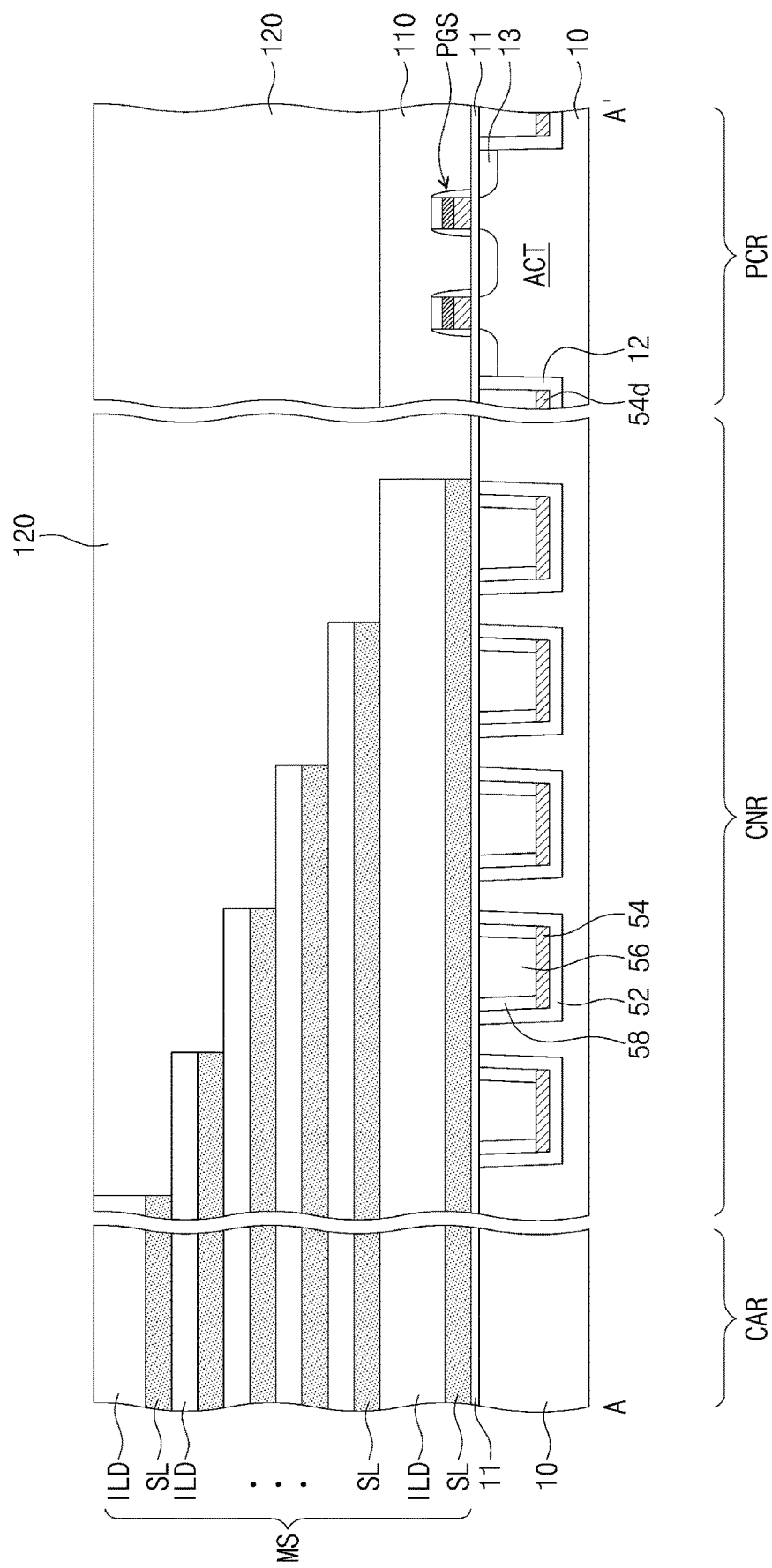

Referring to FIGS. 18A and 18B, according to an embodiment, after forming peripheral logic circuits, such as the peripheral gate stacks PGS and the source/drain is impurity regions 13, the peripheral insulating layer 110 is formed that covers the substrate 10 and the peripheral gate stack PGS. The peripheral insulating layer 110 includes a plurality of insulating layers, such as at least two layers of a silicon oxide layer, a silicon nitride layer, a silicon oxynitride layer, or a low-k dielectric layer.

Next, according to an embodiment, a mold structure MS is formed on the cell array region CAR and the connection region CNR of the substrate 10. The mold structure MS includes sacrificial layers SL and the insulating layers ILD, which are vertically and alternately stacked on the substrate 10.

In the mold structure MS, according to an embodiment, the sacrificial layers SL are formed of a material that has an etch selectivity with respect to the insulating layers ILD. For example, the sacrificial layers SL are formed of an insulating material different from the insulating layers ILD. For example, the sacrificial layers SL are formed of silicon nitride, and the insulating layers ILD are formed of silicon oxide. The sacrificial layers SL have substantially the same thickness, and at least one of the insulating layers ILD has a thickness different from the others.

In more detail, according to an embodiment, forming the mold structure MS includes forming a layered structure, in which the sacrificial layers SL and the insulating layers ILD are sequentially and alternately stacked, on the substrate 10, and performing a trimming process On the layered structure. According to an embodiment, the trimming process includes steps of forming a mask pattern that covers the layered structure on the cell array region CAR and the connection region CNR, etching the layered structure using the mask pattern as an etch mask, etching the mask pattern to reduce a planar area of the mask pattern, and removing the mask pattern, and the steps of etching the layered structure and the mask pattern are repeated several times before removing the mask pattern.

According to an embodiment, as a result of the trimming process, the mold structure MS has a staircase structure whose height decreases in a stepwise manner in a direction from the connection region CNR toward the peripheral circuit region PCR. The mold structure MS has a vertical height that is higher than that of the peripheral circuit structure PSTR. For example, the vertical height of the mold structure MS is greater than or equal to about 2 times the height of the peripheral circuit structure PSTR.

Figure 19B:
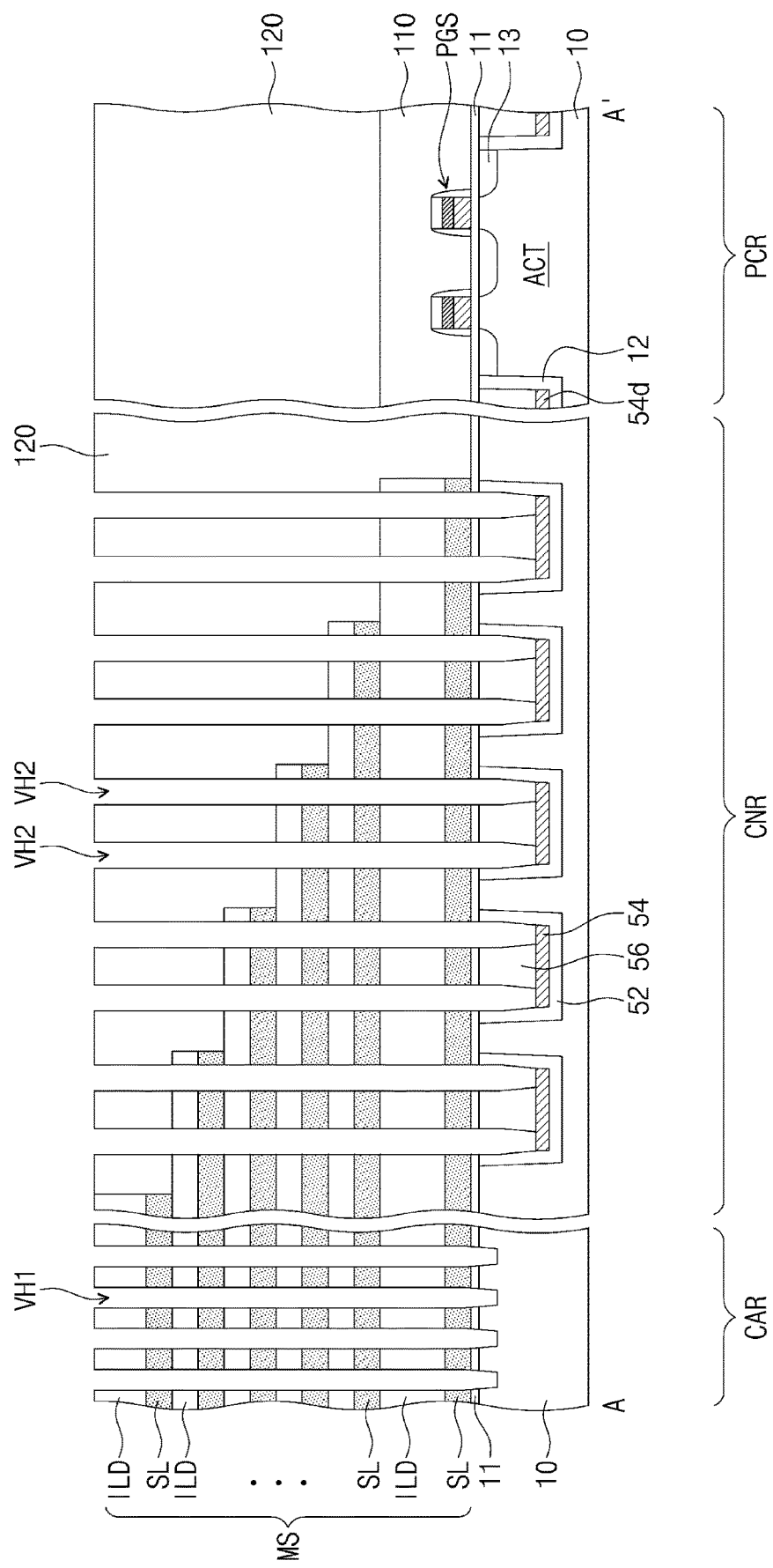

Referring to FIGS. 19A and 19B, according to an embodiment, after forming the mold structure MS, the planarized insulating layer 120 is formed on the substrate 10. The planarized insulating layer 120 covers not only the mold structure MS but also the peripheral circuit structure PSTR and has a substantially flat top surface. The planarized insulating layer 120 is formed of an insulating material that has an etch selectivity with respect to the sacrificial layers SL.

According to an embodiment, after forming the planarized insulating layer 120, first vertical holes VH1 are formed on the cell array region CAR, and second vertical holes VH2 are formed on the connection region CNR. The first vertical holes VH1 penetrate the mold structure MS and expose the substrate 10. The second vertical holes VH2 penetrate the planarized insulating layer 120, the mold structure MS, and the first buried insulating pattern 56 and expose the etch stop pattern 54.

According to an embodiment, forming the first and second vertical holes VH1 and VH2 includes forming a mask pattern on the mold structure MS and the planarized insulating layer 120 and anisotropically etching the mold structure MS and the planarized insulating layer 120 using the mask pattern as an, etch mask.

According to an embodiment, the first vertical holes VH1 are arranged in a specific direction or in a zigzag shape, when viewed in a plan view. The second vertical holes VH2 are arranged in a specific direction, when viewed in a plan view, and the second vertical holes VH2 penetrate the staircase portion of the mold structure MS. In an embodiment, a plurality of the second vertical holes VH2 penetrate an end portion of each sacrificial layer, on the connection region CNR.

According to an embodiment, the number of the sacrificial layers SL pierced by the second vertical holes VH2 decreases with decreasing distance from the peripheral circuit region PCR. In addition, the second vertical holes VH2 have greater widths, i.e., diameters, than the first vertical holes VH1.

According to an embodiment, when an anisotropic etching process that forms the first vertical holes VH1 is performed in an over-etching manner, the top surface of the substrate 10 exposed by the first vertical holes VH1 is recessed to a specific depth.

According to an embodiment of the inventive concept, in the anisotropic etching process that forms the first and second vertical holes VH1 and VH2, since here is a difference in etch rate between the substrate 10 and the first and second buried insulating patterns 56 and 58, the bottom surfaces of the second vertical holes VH2 are positioned below the bottom surfaces of the first vertical holes VH1. In other words, during the over-etching of the top surface of the substrate 10 through the first vertical holes VH1, the first and second buried insulating patterns 56 and 58 are etched through the second vertical holes VH2, and the anisotropic etching process is performed until the etch stop patterns 54 below the first and second buried insulating patterns 56 and 58 are exposed. That is, when the substrate 10 is exposed through the bottom surfaces of the first vertical holes VH1, the second vertical holes VH2 penetrate the first buried insulating pattern 56 and expose the etch stop pattern 54. In other words, during formation of the second vertical holes VH2, since the etch stop pattern 54 is used as an etch stop layer, the substrate 10 is prevented from being exposed through the second vertical holes VH2.

Figure 19C:
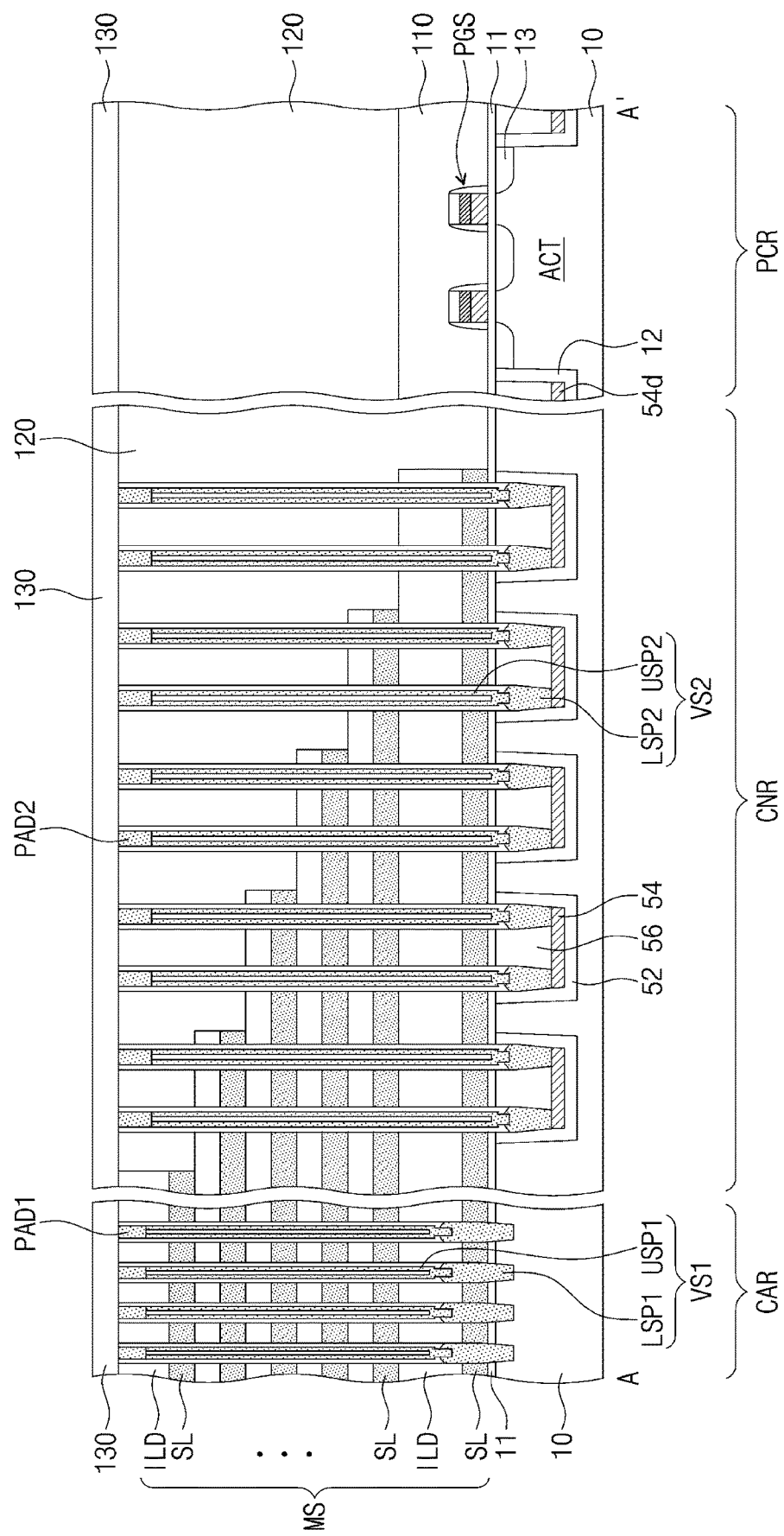

Referring to FIGS. 19A and 19C, according to an embodiment, the first and second lower semiconductor patterns LSP1 and LSP2 are formed that fill lower portions of the first and second vertical holes VH1 and VH2.

According to an embodiment, the first lower semiconductor patterns LSP1 are formed by a selective epitaxial growth (SEG) process in which the substrate 10 exposed by the first vertical holes VH1 is used as a seed layer.

According to an embodiment, when the etch stop patterns 54 include a semiconductor material, the second lower semiconductor patterns LSP2 is formed by a selective epitaxial growth process in which the etch stop patterns 54 exposed by the second vertical holes VH2 are used as a seed layer. In an embodiment, the second lower semiconductor patterns LSP2 and the first lower semiconductor patterns LSP1 are formed at the same time. The first and second lower semiconductor patterns LSP1 and LSP2 are pillar-shape patterns that fill lower portions of the first and second vertical holes VH1 and VH2.

According to an embodiment, the first and second lower semiconductor patterns LSP1 and LSP2 may have a single crystalline structure or a polycrystalline structure, whose grain size is larger than that of patterns formed by a chemical vapor deposition technique. In an embodiment, a grain size of the first lower semiconductor pattern LSP1 differs from that of the second lower semiconductor pattern LSP2.

In an embodiment, the first lower semiconductor patterns LSP1 are formed of a single crystalline semiconductor material, and the second lower semiconductor patterns LSP2 are formed of a polycrystalline semiconductor material, such as poly silicon. Materials for the first and second lower semiconductor patterns LSP1 and LSP2 include silicon, but embodiments of the inventive concept are not limited thereto. For example, carbon nanostructures, organic semiconductor materials, or compound semiconductors can be used for the lower semiconductor patterns LSP1 and LSP2.

Furthermore, according to an embodiment, the first lower semiconductor patterns LSP1 have the same conductivity type as the substrate 10. In an embodiment, during the selective epitaxial growth process, the first lower semiconductor patterns LSP1 are doped with impurities in an in-situ manner.

According to an embodiment of the inventive concept, when the first and second lower semiconductor patterns LSP1 and LSP2 are formed using a selective epitaxial growth (SEG) process, the first lower semiconductor pattern LSP1 and the second lower semiconductor pattern LSP2 have heights that differ from each other. For example, the height of the second lower semiconductor patterns LSP2 is less than the height of the first lower semiconductor patterns LSP1.

According to an embodiment, top surfaces of the first lower semiconductor patterns LSP1 are positioned above the top surface of the lowermost sacrificial layer SL, and top surfaces of the second lower semiconductor patterns LSP2 are positioned below the bottom surface of the lowermost sacrificial layer SL, i.e., the top surface of the substrate 10. In addition, a sidewall of the first lower semiconductor pattern LSP1 makes direct contact with the lowermost sacrificial layer SL, and a sidewall of the second lower semiconductor pattern LSP2 makes direct contact with the buried insulating pattern 56. Furthermore, the height of the second lower semiconductor pattern LSP2 decreases with decreasing distance between the second vertical holes VH2 and the peripheral circuit region PCR.

Furthermore, in an embodiment, the process of forming the first and second lower semiconductor patterns LSP1 and LSP2 may be omitted, as shown in FIG. 5. In an embodiment, as shown in FIG. 6, the second lower semiconductor patterns LSP2 are not formed during formation of the first lower semiconductor patterns LSP1 on the cell array region CAR.

Next, according to an embodiment, referring to FIGS. 19A and 19C, the first vertical insulating patterns VP1 and the first upper semiconductor patterns USP1 are formed, in the first vertical holes VH1 provided with the first lower semiconductor patterns LSP1, and the second vertical insulating patterns VP2 and the second upper semiconductor patterns USP2 are formed in the second vertical holes VH2 provided with the second lower semiconductor patterns LSP2.

According to an embodiment, the first and second vertical insulating patterns VP1 and VP2 are formed at the same time, and the formation of the first and second vertical insulating patterns VP1 and VP2 includes depositing a vertical insulating layer and a semiconductor layer to conformally cover inner surfaces of the first and second vertical holes VH1 and VH2 and performing an anisotropic etching process on the vertical insulating layer and the semiconductor layer to expose portions of the first and second lower semiconductor patterns LSP1 and LSP2.

According to an embodiment, when the second lower semiconductor patterns LSP2 are omitted, the second vertical insulating patterns VP2 are formed on the etch stop pattern 54 and in the second vertical holes VH2.

As described above, according to an embodiment, the first and second vertical insulating patterns VP1 and VP2 are formed of a single layer or a plurality of layers and are a part of the data storing layer.

Next, according to an embodiment, the first and second upper semiconductor patterns USP1 and USP2 may be simultaneously formed in the fast and second vertical holes VH1 and VH2.

According to an embodiment, the first and second upper semiconductor patterns USP1 and USP2 are formed by depositing a semiconductor layer of a uniform thickness in the first and second vertical holes VH1 and VH2 in the first and second vertical insulating patterns VP1 and VP2. According to an embodiment, the semiconductor layer has a conformal thickness but may be too thin to fill the entirety of the first and second vertical holes VH1 and VH2. Thus, the first and second upper semiconductor patterns USP1 and USP2 include empty spaces or gap regions in the first and second vertical holes VH1 and VH2, and the empty spaces are filled with an insulating gapfill layer or an air.

For example, the first and second upper semiconductor patterns USP1 and USP2 are connected, to the first and second lower semiconductor patterns LSP1 and LSP2, respectively. For another example, when the second lower semiconductor patterns LSP2 are omitted, the second upper semiconductor patterns USP2 make contact with the etch stop pattern 54.

Furthermore, according to an embodiment, the bit line conductive pads PAD1 and the dummy conductive pads PAD2 are formed on the first and second upper semiconductor patterns USP1 and USP2. The bit line and dummy conductive pads PAD1 and PAD2 are impurity regions doped with impurities or are formed of a conductive material.

According to an embodiment, after forming the bit line conductive pads PAD1 and the dummy conductive pads PAD2, the first interlayered insulating layer 130 is formed on the mold structure MS and the planarized insulating layer 120.

Figure 20B:
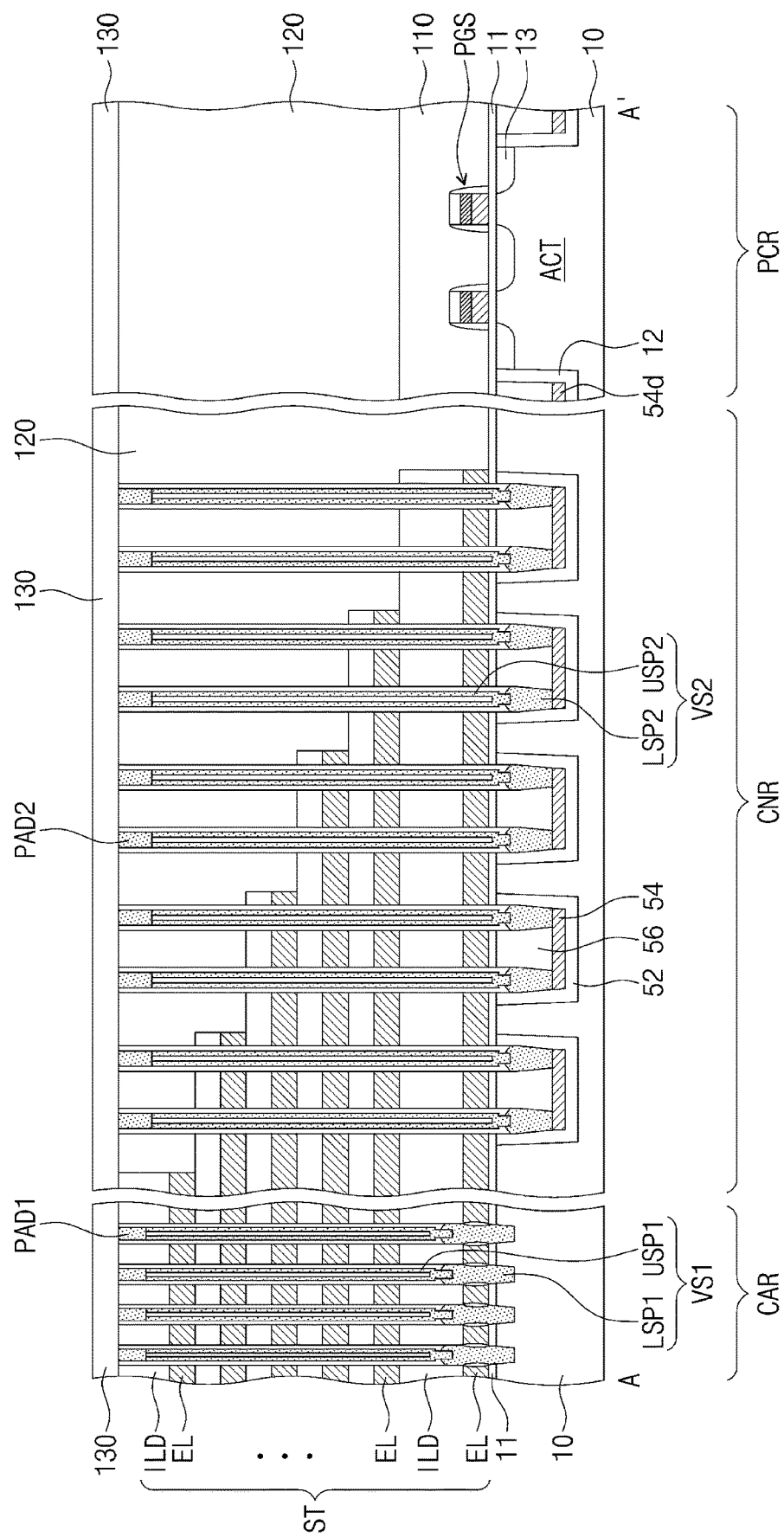

Referring to FIGS. 20A and 20B, according, to an embodiment, after forming the first interlayered insulating layer 130, trenches T are formed that penetrate the mold structure MS and that expose the substrate 10. The trenches T extend in the first direction D1 and are spaced apart from each other in the second direction D2. The trenches T are spaced apart from the cell and dummy channel structures VS1 and VS2 and expose sidewalls of the sacrificial layers SL and the insulating layers ILD.

According to an embodiment, after forming the trenches T, a replacement process is performed to replace the sacrificial layers SL, which are exposed by the trenches T, with the electrodes EL.

According to an embodiment, the replacement process includes, removing the sacrificial layers SL exposed by the trenches T to form gate regions between the insulating layers ILD and forming the electrodes EL in the gate regions, respectively. According to an embodiment, forming the gate regions includes isotropically etching the sacrificial layers SL using an etch recipe that has an etch selectivity with respect to the planarized insulating layer 120, the insulating layers ILD, the cell and dummy channel structures VS1 and VS2, and the substrate 10. According to an embodiment of the inventive concept, a lowermost gate region exposes portions of sidewalls of the first lower semiconductor patterns LSP1 on the cell array region CAR and portions of sidewalls of the second vertical insulating patterns VP2 on the connection region CNR. In other words, in a process of removing the sacrificial layers SL of the mold structure MS, the second lower semiconductor patterns LSP2 are not exposed by the gate regions.

According to an embodiment, before forming the electrodes EL in the gate regions, the gate insulating layer 15 is formed on the sidewall of the first lower semiconductor pattern LSP1 exposed by the lowermost gate region. The gate insulating layer is formed by a thermal treatment process performed in an oxygen-containing gas atmosphere. Thus, the sidewall of the first lower semiconductor pattern LSP1 exposed by the gate region is thermally oxidized to form the gate insulating layer 15.

Next, according to an embodiment, a horizontal insulating layer, a barrier metal layer, and a metal layer are sequentially deposited on the mold structure MS with the gate regions, and then, the barrier metal layer and the metal layer deposited on the trench are anisotropically etched to form the electrodes EL in the gate regions, respectively. According to an embodiment, the horizontal insulating layer is part of the data storing layer and includes a silicon oxide layer or a high-k dielectric layer. The barrier metal layer is formed of or includes a metal nitride layer, such as TiN, TaN, or WN. In addition, the metal layer is formed of or includes at least one metal, such as W, Al, Ti, Ta, Co, or Cu.

According to an embodiment, since the sacrificial layers SL of the mold structure MS are replaced with the electrodes EL, the electrode structure ST, in which the electrodes EL and the insulating layers ILD are vertically and alternately stacked, is formed, as described with reference to FIGS. 2A, 2B, and 2C.

Furthermore, according to an embodiment, the common source regions CSR are formed in the substrate 10 exposed by the trenches T. The common source regions CSR are formed by doping the exposed portions of the substrate 10 with impurities, which are of a different conductivity type from that of the substrate 10. The common source regions CSR include, for example, n-type impurities, such as arsenic (As) or phosphorus P.

Next, according to an embodiment, as shown in FIGS. 2B and 2C, the sidewall spacers SS are formed to cover sidewalls of the electrode structure ST. The formation of the sidewall spacer SS includes depositing a spacer layer on the substrate 10 with the electrode structures ST to a uniform thickness and performing an etch-hack process on the spacer layer to expose the common source region CSR. Here, the spacer layer is formed of an insulating material, and in an embodiment, the spacer layer is formed of at least one of silicon oxide, silicon nitride, silicon oxynitride or a low-k dielectric material having a low dielectric constant.

According to an embodiment, the common source plugs CSP are formed in each trench with the sidewall spacer SS. In an embodiment, the common source plugs CSP are disposed between each horizontally-adjacent pair of the electrodes EL, and the sidewall spacer SS are interposed between the electrodes EL and the common source plug CSP. In other words, the sidewall spacers SS cover sidewalls of the common source plugs CSP. Furthermore, the common source plugs CSP extend parallel to the electrodes EL, and the top surface of the common source plugs CSP are positioned above the top surfaces of the cell and dummy channel structures VS1 and VS2.

Thereafter, according to an embodiment, the second interlayered insulating layer 140 is formed on the first interlayered insulating layer 130 and covers the top surface of the common source plug CSP. The bit line contact plugs BPLG are formed that penetrate the first and second interlayered insulating layers 130 and 140 and are coupled to the cell channel structures. VS1, respectively. Furthermore, the cell contact plugs CPLG are formed on the connection region CNR and are coupled to the electrodes EL, respectively, and the peripheral contact plugs PPLG are funned that penetrate the first and second interlayered insulating layers 130 and 140 and the planarized insulating layer 120 and are coupled to the peripheral logic circuits. Next, the bit lines BL and connection lines CL described above are formed on the second interlayered insulating layer 140.

According to an embodiment of the inventive concept, on a connection region, dummy channel structures are spaced apart from a substrate by an etch stop pattern. In other words, the dummy channel structures are electrically separated from the substrate. Thus, even if a cell contact plug coupled to the electrode is disposed adjacent to or in contact with the dummy channel structures, an electric short circuit can be prevented between the cell contact plug and the substrate through the dummy channel structures during operation of a three-dimensional semiconductor memory device, and consequently the reliability and electric characteristics of the three-dimensional semiconductor memory device can be improved.

Furthermore, according to an embodiment, the dummy channel structures have an elliptical shape, and top surfaces of epitaxial patterns in the dummy channel structures are positioned below the lowermost electrode. Accordingly, uniform distances between an upper semiconductor pattern of the vertical structure and an electrode structure can be realized. In other words, breakdown voltage characteristics of ground selection transistors provided on the connection region can be improved.

While exemplary embodiments of the inventive concepts have been particularly shown and described, it will be understood by one of ordinary skill in the art that variations in form and detail may be made therein without departing from the spirit and scope of the attached claims.

What is claimed is:

1. A three-dimensional (3D) semiconductor memory device, comprising:
   a substrate that includes a cell array region and a connection region, the substrate including a dummy trench on the connection region;
   an electrode structure disposed on the substrate and that includes vertically stacked electrodes that have a staircase structure on the connection region;
   a dummy insulating structure disposed in the dummy trench, the dummy insulating structure comprising an etch stop pattern spaced apart from the substrate and the electrode structure;
   a cell channel structure disposed on the cell array region that penetrates the electrode structure and makes contact with the substrate; and
   a dummy channel structure disposed on the connection region that penetrates the electrode structure and a portion of the dummy insulating structure and makes contact with the etch stop pattern.

2. The 3D semiconductor memory device of claim 1, wherein the etch stop pattern comprises a bottom portion that extends parallel to a top surface of the substrate and a sidewall portion that protrudes from the bottom portion along a sidewall of the dummy trench.

3. The 3D semiconductor memory device of claim 1, wherein the dummy insulating structure further comprises:
   a dummy insulating pattern disposed between a bottom surface of the etch stop pattern and the substrate and that covers an inner surface of the dummy trench; and
   a buried insulating pattern disposed between a top surface of the etch stop pattern and the electrode structure,
   wherein a portion of the buried insulating pattern is disposed between the dummy insulating pattern and a sidewall of the etch stop pattern.

4. The 3D semiconductor memory device of claim 1, wherein the dummy insulating structure comprises:
   a dummy insulating pattern disposed between a bottom surface of the etch stop pattern and the substrate and that covers an inner surface of the dummy trench; and
   a buried insulating pattern disposed between a top surface of the etch stop pattern and the electrode structure,
   wherein the dummy channel structure comprises a lower semiconductor pattern on the etch stop pattern and an upper semiconductor pattern on the lower semiconductor pattern, and
   a sidewall of the lower semiconductor pattern makes contact with the buried insulating pattern.

5. The 3D semiconductor memory device of claim 1, wherein a top surface of the dummy channel structure is positioned at a same level as a top surface of the cell channel structure,
   the top surface of the cell channel structure has a first width, and
   the top surface of the dummy channel structure has a second width greater than the first width.

6. The 3D semiconductor memory device of claim 1, wherein a top surface of the dummy channel structure is positioned at a same level as a top surface of the cell channel structure,
   the top surface of the dummy channel structure has a minor axis and a major axis perpendicular to the minor axis,
   the minor axis of the dummy channel structure has a first width and the major axis of the dummy channel structure has a first length greater than the first width, and
   a maximum width of the top surface of the cell channel structure is a second width that is less than the first width.

7. The 3D semiconductor memory device of claim 1, wherein the electrode structure extends in a first direction,
   a top surface of the dummy channel structure has major axis with a first length and minor axis with a first width that is less than the first length, and
   the major axis of the top surface of the dummy channel structure is inclined with respect to the first direction.

8. The 3D semiconductor memory device of claim 1, wherein a plurality of dummy insulating structures are disposed below the electrode structure of the connection region, and
   the plurality of dummy insulating structures are spaced apart from each other in a first direction and a second direction that crosses the first direction.

9. The 3D semiconductor memory device of claim 1, wherein the electrode structure extends in a first direction,
   sides surfaces of vertically adjacent electrodes on the connection region are spaced apart from each other in the first direction by a first distance, and
   a length of the dummy insulating structure in the first direction is less than the first distance.

10. The 3D semiconductor memory device of claim 1, wherein the electrode structure extends in a first direction,
    sides surfaces of vertically adjacent electrodes on the connection region are spaced apart from each other in the first direction by a first distance, and
    a length of the dummy insulating structure in the first direction is greater than the first distance.

11. The 3D semiconductor memory device of claim 1, further comprising a plurality of electrode separation structures that extend parallel to the electrode structure,
    wherein the electrode structure and the etch stop pattern are disposed between adjacent electrode separation structures.

12. The 3D semiconductor memory device of claim 1, wherein the substrate further comprises a peripheral circuit region, and
    wherein the device further comprises:
    a device isolation pattern disposed in the peripheral circuit region of the substrate that delimits a peripheral active region; and a dummy pattern disposed in the device isolation pattern, the dummy pattern comprising a same material as the etch stop pattern.

13. A three-dimensional (3D) semiconductor memory device, comprising:
a substrate that includes a cell array region and a connection region;
an electrode structure disposed on the substrate and that includes vertically stacked electrodes that have a stepwise structure on the connection region;
a cell channel structure disposed on the cell array region and that penetrates the electrode structure;
a dummy channel structure disposed on the connection region and that penetrates the electrode structure;
a dummy insulating pattern disposed between the dummy channel structure and the substrate; and
an etch stop pattern disposed between the dummy insulating pattern and the dummy channel structure,
wherein a top surface of the etch stop pattern is positioned below a bottom surface of the cell channel structure.

14. The 3D semiconductor memory device of claim 13, wherein the cell channel structure comprises a first lower semiconductor pattern disposed on the substrate and a first upper semiconductor pattern disposed on the first lower semiconductor pattern, and
the dummy channel structure comprises a second lower semiconductor pattern disposed on the etch stop pattern and a second upper semiconductor pattern disposed on the second lower semiconductor pattern,
a top surface of the first lower semiconductor pattern is positioned above a top surface of a lowermost electrode of the electrodes,
a top surface of the second lower semiconductor pattern is positioned below a bottom surface of the lowermost electrode.

15. The 3D semiconductor memory device of claim 13, further comprising a buried insulating pattern disposed between the etch stop pattern and the electrode structure and that makes contact with a portion of the dummy insulating pattern,
wherein the dummy channel structure penetrates the buried insulating pattern.

16. The 3D semiconductor memory device of claim 15, wherein a top surface of the buried insulating pattern and a top surface of the dummy insulating pattern are positioned above the bottom surface of the cell channel structure.

17. A three-dimensional (3D) semiconductor memory device, comprising:
a substrate that includes a cell array region and a connection region;
a dummy insulating pattern disposed in the substrate and on the connection region;
an electrode structure disposed on the substrate and that includes vertically stacked electrodes that extend from the cell array region to the connection region in a first direction;
a cell channel structure disposed on the cell array region and that penetrates the electrode structure; and
a plurality of dummy channel structures disposed on the connection region and that penetrate the electrode structure and the dummy insulating pattern,
wherein a top surface of each of the dummy channel structures has major axis with a first length and a minor axis with a first width that is less than the first length, and
the major axes of the dummy channel structures extend in directions different from each other, when viewed in a plan view.

18. The 3D semiconductor memory device of claim 17, wherein a top surface of the cell channel structure has a second width that is less than the first width, and
the major axes of the dummy channel structures extend in directions inclined with respect to the first direction.

19. The 3D semiconductor memory device of claim 17, wherein each of the cell structure and the dummy channel structures comprises a lower semiconductor pattern connected to the substrate and an upper semiconductor pattern connected to the lower semiconductor pattern,
in the cell channel structure, a top surface of the lower semiconductor pattern is positioned above a top surface of a lowermost electrode of the electrodes, and
in the dummy channel structures, a top surface of the lower semiconductor pattern is positioned below a bottom surface of the lowermost electrode of the electrodes.

20. The 3D semiconductor memory device of claim 17, further comprising a plurality of contact plugs disposed on the connection region and coupled to the electrodes, respectively,
wherein a plurality of the dummy channel structures are disposed around each of the contact plugs, and
the major axes of top surfaces of the plurality of the dummy channel structures extend in directions inclined with respect to the first direction.

* * * * *